United States Patent
Oh et al.

(10) Patent No.: US 10,741,516 B2
(45) Date of Patent: Aug. 11, 2020

(54) DRIVE INTEGRATED CIRCUIT AND DISPLAY DEVICE INCLUDING THE SAME

(71) Applicant: SILICON WORKS CO., LTD., Daejeon (KR)

(72) Inventors: Myeong Woo Oh, Daejeon (KR); Yong Nam Choi, Daejeon (KR); Dong Geon Lee, Daejeon (KR); Dong Wook Kim, Daejeon (KR); Jae Sup Han, Daejeon (KR); Eun Ji Jo, Daejeon (KR)

(73) Assignee: SILICON WORKS CO., LTD., Daejeon (KR)

( * ) Notice: Subject to any disclaimer, the term of this patent is extended or adjusted under 35 U.S.C. 154(b) by 11 days.

(21) Appl. No.: 16/188,530

(22) Filed: Nov. 13, 2018

(65) Prior Publication Data

US 2019/0157231 A1    May 23, 2019

(30) Foreign Application Priority Data

Nov. 17, 2017    (KR) .................. 10-2017-0153566

(51) Int. Cl.
*H01L 23/48* (2006.01)
*H01L 23/52* (2006.01)
(Continued)

(52) U.S. Cl.
CPC .......... *H01L 24/14* (2013.01); *H01L 23/4985* (2013.01); *H01L 23/528* (2013.01);
(Continued)

(58) Field of Classification Search
CPC ..... H01L 24/14; H01L 24/05; H01L 27/0288; H01L 27/0255; H01L 27/0296; H01L 23/528; H01L 23/4985; H01L 24/16; H01L 25/18; H01L 27/124; H01L 24/06; H01L 27/1255; H01L 2224/06181;
(Continued)

(56) References Cited

U.S. PATENT DOCUMENTS

2008/0203435 A1* 8/2008 Kobayashi .......... H01L 27/0251
257/203
2009/0134467 A1* 5/2009 Ishida ..................... H01L 27/11
257/368

(Continued)

FOREIGN PATENT DOCUMENTS

KR   10-0805499         2/2008
KR   10-0903533         6/2009
KR   10-2016-0126765 A  11/2016

*Primary Examiner* — Ismail A Muse
(74) *Attorney, Agent, or Firm* — Harness, Dickey & Pierce, P.L.C.

(57) ABSTRACT

Disclosed are a drive integrated circuit (IC) capable of being applied to all of a chip on film (COF) type and a chip on glass (COG) type and a display device including the drive IC. The drive IC includes an input pad part including a plurality of input bumps and an output pad part including a plurality of first diode parts, a plurality of second diode parts, and a plurality of output bumps. At least two of the plurality of output bumps overlap the plurality of first diode parts and the plurality of second diode parts, and a first output bump of the at least two output bumps is connected to at least one of the plurality of first diode parts and at least one of the plurality of second diode parts.

20 Claims, 15 Drawing Sheets

(51) Int. Cl.
  *H01L 29/40* (2006.01)
  *H01L 23/00* (2006.01)
  *H01L 27/12* (2006.01)
  *H01L 25/18* (2006.01)
  *H01L 23/498* (2006.01)
  *H01L 23/528* (2006.01)
  *H01L 27/02* (2006.01)
  H01L 23/522 (2006.01)
  G09G 3/3275 (2016.01)
  G09G 3/3266 (2016.01)
  G09G 3/36 (2006.01)
  G09G 3/32 (2016.01)

(52) U.S. Cl.
  CPC ............ *H01L 24/05* (2013.01); *H01L 24/06* (2013.01); *H01L 24/16* (2013.01); *H01L 25/18* (2013.01); *H01L 27/0255* (2013.01); *H01L 27/0288* (2013.01); *H01L 27/0296* (2013.01); *H01L 27/124* (2013.01); *G09G 3/32* (2013.01); *G09G 3/3266* (2013.01); *G09G 3/3275* (2013.01); *G09G 3/3677* (2013.01); *G09G 3/3688* (2013.01); *G09G 2310/08* (2013.01); *H01L 23/5226* (2013.01); *H01L 23/5228* (2013.01); *H01L 27/1255* (2013.01); *H01L 2224/0401* (2013.01); *H01L 2224/0557* (2013.01); *H01L 2224/06181* (2013.01); *H01L 2224/1412* (2013.01); *H01L 2224/14515* (2013.01); *H01L 2224/16145* (2013.01); *H01L 2224/16227* (2013.01)

(58) Field of Classification Search
  CPC ..... H01L 2224/0557; H01L 2224/0401; H01L 2224/16145; H01L 2224/16227; H01L 2224/14515; H01L 2224/1412; H01L 23/5226; H01L 23/5228; H01L 2224/05568; H01L 2224/05008; H01L 2224/05569; H01L 2924/00014; H01L 24/13; H01L 2224/14517; H01L 2224/13013; H01L 2224/13023; G09G 3/32; G09G 3/3677; G09G 3/3688; G09G 3/3266; G09G 3/3275; G09G 2310/08
  See application file for complete search history.

(56) References Cited

U.S. PATENT DOCUMENTS

| | | | |
|---|---|---|---|
| 2009/0206411 A1* | 8/2009 | Koketsu | H01L 29/78 257/368 |
| 2010/0025681 A1* | 2/2010 | Katoh | H01L 24/81 257/48 |
| 2012/0025372 A1* | 2/2012 | Tang | H01L 21/027 257/737 |
| 2012/0161805 A1* | 6/2012 | Jung | G09G 3/3648 324/754.07 |
| 2014/0008793 A1* | 1/2014 | Suzuki | G02F 1/13452 257/737 |
| 2014/0117998 A1* | 5/2014 | Hwang | G09G 3/006 324/511 |
| 2015/0108611 A1* | 4/2015 | Kumagai | H01L 23/5226 257/620 |
| 2015/0255452 A1* | 9/2015 | Suzuki | H01L 27/0207 257/737 |
| 2015/0364463 A1* | 12/2015 | Suzuki | H01L 27/0255 257/355 |
| 2016/0315078 A1* | 10/2016 | Suzuki | H01L 24/13 |
| 2017/0243847 A1* | 8/2017 | Suzuki | H01L 23/5226 |
| 2019/0027455 A1* | 1/2019 | Suzuki | H01L 27/0207 |
| 2019/0033646 A1* | 1/2019 | Shimizu | G02F 1/13452 |

\* cited by examiner

DRIVE INTEGRATED CIRCUIT AND DISPLAY DEVICE INCLUDING THE SAME

CROSS-REFERENCE TO RELATED APPLICATIONS

This application claims the benefit of the Korean Patent Application No. 10-2017-0153566 filed on Nov. 17, 2017, which is hereby incorporated by reference as if fully set forth herein.

FIELD

The present disclosure relates to a drive integrated circuit (IC) and a display device including the same.

BACKGROUND

With the advancement of information-oriented society, various requirements for display devices for displaying an image are increasing. Therefore, various display devices such as liquid crystal display (LCD) devices and light emitting display devices are being practically used. Examples of light emitting display devices include organic light emitting display devices, which use an organic light emitting device as a light emitting device, and micro light emitting display devices which use a micro light emitting diode as a light emitting device.

Display devices each include a display panel which includes a plurality of data lines, a plurality of gate lines, and a plurality of pixels connected to the data lines and the gate lines, a gate driver which supplies gate signals to the gate lines, a data driver which supplies data voltages to the data lines, and a timing controller which controls an operation timing of each of the gate driver and the data driver. The data driver includes at least one source drive IC.

The source drive IC is connected to the data lines, for supplying the data voltages to the data lines of the display panel. In this case, the source drive IC may be connected to the data lines as a chip on film (COF) type or a chip on glass (COG) type.

In detail, in the COF type, the source drive IC is attached on a flexible film (or a tape carrier package) by using an anisotropy conductive film. Subsequently, the flexible film with the source drive IC attached thereon is attached on a plurality of pads which are provided on a substrate of the display panel and are connected to the data lines. On the other hand, in the COG type, the source drive IC is directly attached on the pads provided on the substrate of the display panel.

In addition to the lines connected to the source drive IC, another line may be provided on the substrate of the display panel. For example, as in FIG. 1, a power line passing through a third side S3 and a fourth side S4 of a source drive IC SIC may be provided. In FIG. 1, a plan view of the source drive IC SIC is illustrated. In FIG. 1, it is illustrated that a first side S1 and a second side S2 of the source drive IC SIC are sides facing each other in a first direction (an X-axis direction) and the third side S3 and the fourth side S4 are sides facing each other in a second direction (a Y-axis direction) intersecting the first direction (the X-axis direction). When the source drive IC SIC is attached as the COG type, input bumps of the source drive IC SIC may be disposed in only the first side S1 and output bumps thereof may be disposed in only the second side S2 as in FIG. 1, for preventing interference between lines connected to the source drive IC SIC and the power line.

Moreover, bumps of the source drive IC SIC attached as the COF type are connected to leads of the flexible film, and bumps of the source drive IC SIC attached as the COG type are connected to the pads provided on the substrate. In this case, a pitch of each of the leads of the flexible film is greater than that of each of the pads of the substrate, and thus, a pitch of each of the bumps of the source drive IC SIC attached as the COF type is greater than that of each of the bumps of the source drive IC SIC attached as the COG type. Therefore, when the source drive IC SIC is attached as the COF type, a length of the source drive IC SIC in the first direction (the X-axis direction) should extend in order for the output bumps of the source drive IC SIC to be disposed in only the second side S2. However, in a case where the output bumps of the source drive IC SIC are disposed in a portion of the first side S1, the third side S3, and the fourth side S4 as well as the second side S2, all of the output bumps may be disposed without extending the length of the source drive IC SIC in the first direction (the X-axis direction).

As described above, when the source drive IC SIC is attached as the COG type, the bumps of the source drive IC SIC are provided in only the first side S1 and the second side S2, for preventing interference between a line connected to the source drive IC SIC and another line (for example, the power line) provided on the substrate. On the other hand, when the source drive IC SIC is attached as the COF type, the bumps of the source drive IC SIC are provided in all of the first side S1, the second side S2, the third side S3, and the fourth side S4 due to an interval between adjacent bumps of the source drive IC SIC. In FIG. 1, it is illustrated that the first side S1, the second side S2, the third side S3, and the fourth side S4 of the source drive IC SIC are an upper side, a lower side, a left side, and a right side of the source drive IC SIC, respectively.

Moreover, the pitch of each bump of the source drive IC SIC attached as the COF type differs from that of each bump of the source drive IC SIC attached as the COG type. That is, a disposed position and a pitch of each bump of the source drive IC SIC are changed based on the COF type and the COG type. Therefore, the source drive IC SIC should be differently designed based on the COF type and the COG type.

The gate driver may include at least one gate drive IC, and in this case, the gate drive IC may have a problem similar to that of the source drive IC.

SUMMARY

Accordingly, the present disclosure is directed to providing a drive integrated circuit (IC) and a display device including the same that substantially obviate one or more problems due to limitations and disadvantages of the related art.

An aspect of the present disclosure is directed to providing a drive IC capable of being applied to all of a chip on film (COF) type and a chip on glass (COG) type and a display device including the drive IC.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a drive IC including an input pad part including a plurality of input bumps and an output pad part including a plurality of first diode parts, a plurality of second diode parts, and a plurality of output bumps, wherein at least two of the plurality of output bumps overlap the plurality of first diode parts and the plurality of second diode parts, and a first output bump of the at least two output bumps is connected to at least one of the plurality of first diode parts and at least one of the plurality of second diode parts.

In another aspect of the present disclosure, there is provided a display device including a lower substrate, a plurality of gate lines and a plurality of data lines each provided on the lower substrate, and a drive integrated circuit (IC) electrically connected to the plurality of gate lines or the plurality of data lines, wherein the drive IC includes an input pad part including a plurality of input bumps and an output pad part including a plurality of first diode parts, a plurality of second diode parts, and a plurality of output bumps, a first output bump of the plurality of output bumps overlaps the plurality of first diode parts and the plurality of second diode parts, and the first output bump is connected to at least one of the plurality of first diode parts and at least one of the plurality of second diode parts.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1:
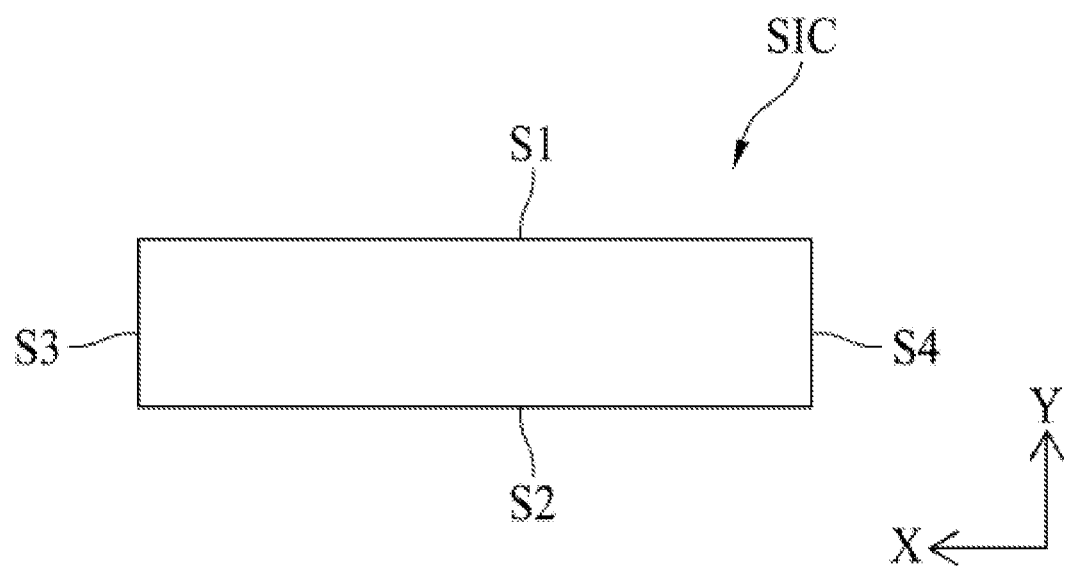
FIG. 1 is an exemplary diagram schematically illustrating a source drive IC.

Reference will now be made in detail to the exemplary embodiments of the present disclosure, examples of which are illustrated in the accompanying drawings. Wherever possible, the same reference numbers will be used throughout the drawings to refer to the same or like parts.

Hereinafter, some embodiments of the present disclosure will be described in detail with reference to the accompanying drawings. In the specification, like reference numerals refer to like elements. In the following description, when the detailed description of the relevant known function or configuration is determined to unnecessarily obscure the important point of the present disclosure, the detailed description will be omitted. A name of each of elements used herein is selected in consideration of easiness of description of the specification and may differ from a name of an actual product.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In construing an element, the element is construed as including an error range although there is no explicit description.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, exemplary embodiments of the present disclosure will be described in detail with reference to the accompanying drawings.

Figure 2:
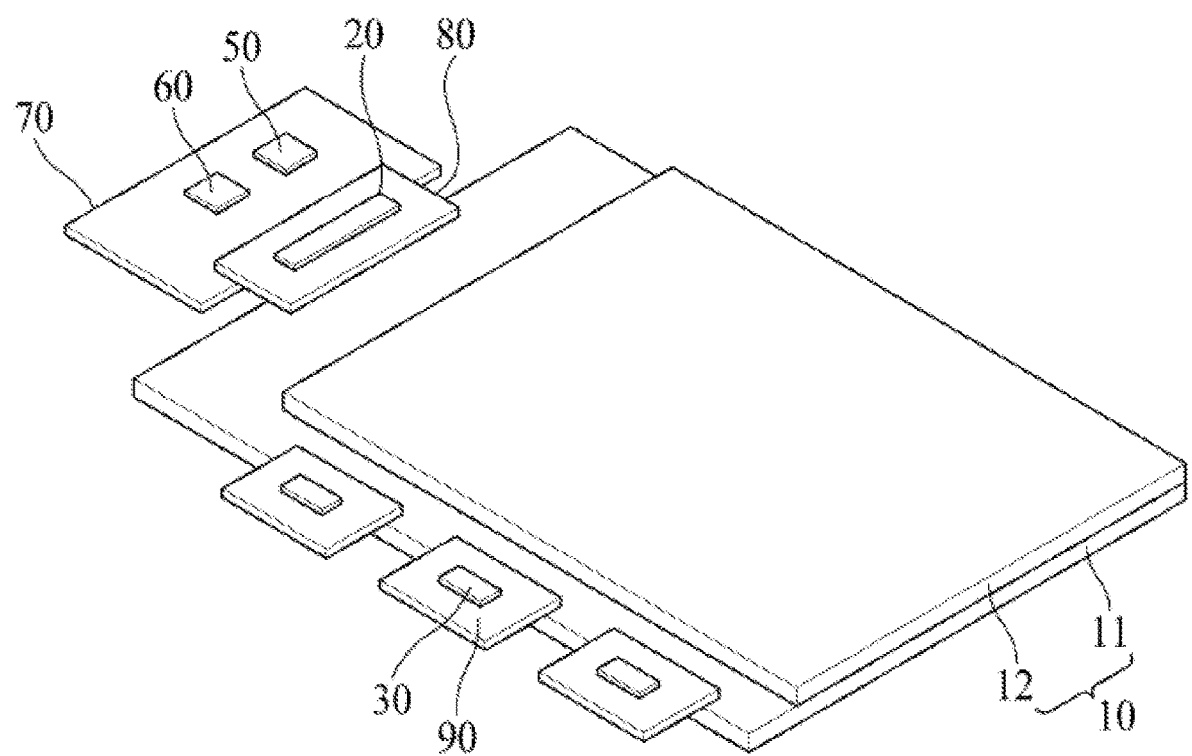
FIG. 2 is a perspective view illustrating a display device where a source drive IC is attached on gate drive ICs as a COF type, according to an embodiment of the present disclosure.

FIG. 2 is a perspective view illustrating a display device where a source drive IC is attached on gate drive ICs as a COF type, according to an embodiment of the present disclosure.

Referring to FIG. 2, the display device according to an embodiment of the present disclosure may include a display panel 10, a source drive integrated circuit (IC) 20, a plurality of gate drive ICs 30, a timing controller 50, a power supply 60, a circuit board 70, a source flexible film 80, and a plurality of gate flexible films 90.

The display device according to an embodiment of the present disclosure may be implemented as one of a liquid crystal display (LCD) device and a light emitting display device, but is not limited thereto. Examples of the light emitting display device may include an organic light emitting display device using an organic light emitting device as a light emitting device and a micro light emitting display device using a micro light emitting diode as a light emitting device.

The display panel 10 may include a first substrate 11 and a second substrate 12. The first substrate 11 may be a glass substrate, a plastic film, or the like. The second substrate 12 may be a plastic film, a glass substrate, an encapsulation film (a barrier film), or the like.

A plurality of data lines, a plurality of scan lines, and a plurality of pixels connected to the data lines and the scan lines may be provided on the first substrate 11. Each of the plurality of pixels may include at least one thin film transistor (TFT), and thus, when a scan signal is input through a corresponding scan line, each pixel may be supplied with a data voltage through a corresponding data line. Each of the pixels may emit light having certain brightness with the supplied data voltage.

The source drive IC 20 may be attached on the display panel 100 as a chip on film (COF) type. In detail, the source drive IC 20 may be implemented as an IC chip and may be attached on leads of the source flexible film 80. The source flexible film 80 may be a tape carrier package, a COF, or the like. The source flexible film 80 may be curved or bent.

The source flexible film 80 may be attached on source pads and line on glass (LOG) pads of the first substrate 11 and pads of the circuit board 70. Therefore, an input pad part of the source drive IC 20 may be connected to the timing controller 50 and the power supply 60 of the circuit board 70, and an output pad part thereof may be connected to the data lines through the source pads of the first substrate 11.

The source drive IC 20 may be supplied with digital video data and a source timing control signal from the timing controller 50. The source drive IC 20 may convert the digital video data into data voltages and may supply the data voltages to the data lines, based on the source timing control signal.

In FIG. 2, the display device is illustrated as including one source drive IC 20, but is not limited thereto. In other embodiments, the display device may include a plurality of source drive ICs 20. In this case, the source flexible film 80 may be provided in plurality, and the source drive ICs 20 may be respectively mounted on the source flexible films 80 and the source flexible films 80 may be respectively attached on the pads of the first substrate (a lower substrate) 11 of the display panel 10 and the pads of the circuit board 70.

The gate drive ICs 30 may be attached on the display panel 10 as the COF type. In detail, each of the gate drive ICs 30 may be implemented as an IC chip and may be attached on leads of the gate flexible film 90. Each of the gate flexible films 90 may be a tape carrier package, a COF, or the like. The gate flexible films 90 may be curved or bent.

The gate flexible films 90 may be attached on gate pads of the first substrate 11 by using an anisotropy conductive film. Therefore, an input pad part of each of the gate drive ICs 30 may be connected to, through the gate pads of the first substrate 11, LOG lines connected to the LOG pads of the first substrate 11. In detail, each of the gate drive ICs 30 may be connected to the timing controller 50 of the circuit board 70 through the gate flexible film 90, the LOG lines, and the source flexible film 80. Also, an output pad part of each of the gate drive ICs 30 may be connected to the gate lines through the gate pads of the first substrate 11.

Each of the gate drive ICs 30 may receive a gate timing control signal from the timing controller 50. The gate drive ICs 30 may generate gate signals and may supply the gate signals to the gate lines, based on the gate timing control signal.

In FIG. 2, for convenience of description, the display device is illustrated as including three gate drive ICs 30, but the number of gate drive ICs 30 is not limited thereto.

Each of the timing controller 50 and the power supply 60 may be implemented as an IC chip and may be mounted on the circuit board 70. The timing controller 50 may receive the digital video data and timing signals from the outside and may generate the data timing control signal for controlling an operation timing of the source drive IC 20 and the gate timing control signal for controlling an operation timing of each of the gate drive ICs 30, based on the timing signals. The timing controller 50 may output the digital video data and the data timing control signal to the source drive IC 20 and may output the gate timing control signal to the gate drive ICs 30.

The power supply 60 may be supplied with a high-level voltage from the outside. The power supply 60 may generate a plurality of driving voltages from the high-level voltage and may supply the driving voltages to the source drive IC 20, the gate drive ICs 30, and the timing controller 50.

The circuit board 70 may be a flexible printed circuit board (FPCB), a printed circuit board (PCB), or the like.

Figure 3:
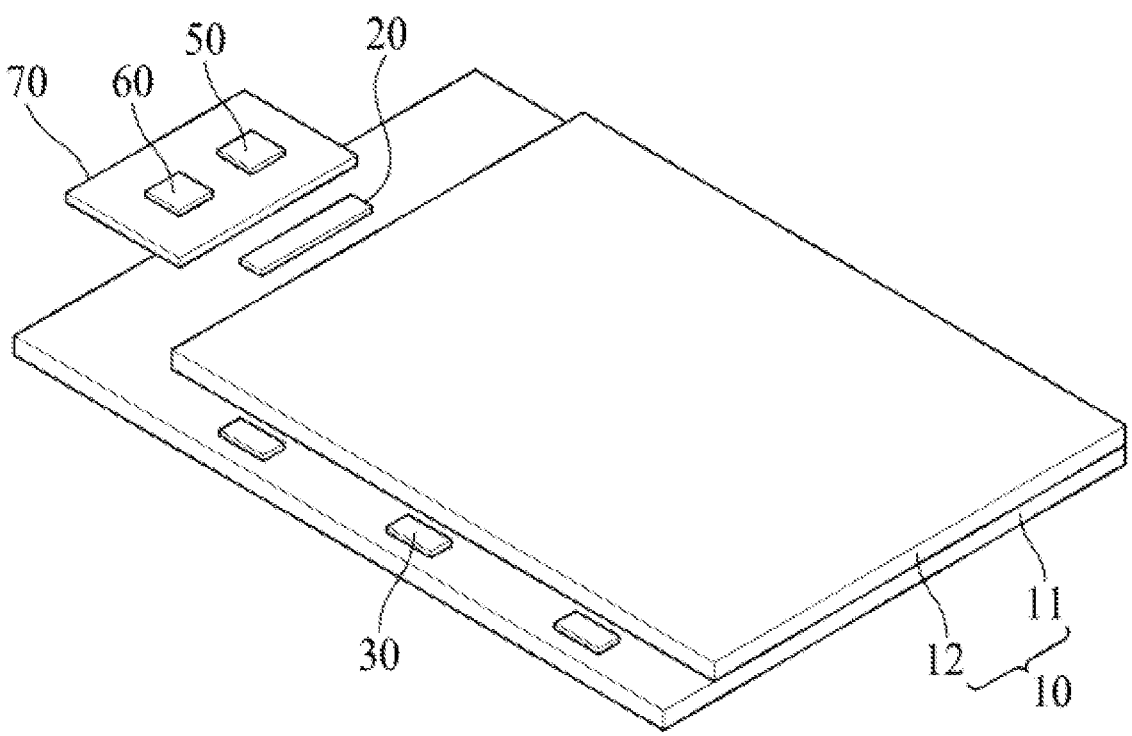
FIG. 3 is a perspective view illustrating a display device where a source drive IC is attached on gate drive ICs as a COG type, according to another embodiment of the present disclosure.

FIG. 3 is a perspective view illustrating a display device where a source drive IC is attached on gate drive ICs as a chip on glass (COG) type, according to another embodiment of the present disclosure.

Referring to FIG. 3, the display device according to another embodiment of the present disclosure may include a display panel 10, a source drive IC 20, a plurality of gate drive ICs 30, a timing controller 50, a power supply 60, and a circuit board 70.

Except for that the source drive IC 20 and the gate drive ICs 30 are attached as the COG type, the display device illustrated in FIG. 3 is substantially the same as described above with reference to FIG. 2. Therefore, detailed descriptions of the display panel 10, the timing controller 50, the power supply 60, and the circuit board 70 illustrated in FIG. 3 are omitted.

In the COG type, a first substrate 11 of the display panel 10 is not limited to a glass substrate and may include plastic.

The source drive IC 20 may be attached on the display panel 10 as the COG type. In detail, the source drive IC 20 may be provided as an IC chip and may be directly attached on source pads and LOG pads of the display panel 10 by using an anisotropy conductive film. Therefore, the source flexible film 80 of FIG. 2 may be omitted. In this case, the circuit board 70 may be directly attached on input pads of the display panel 10 connected to some of the source pads by using an anisotropy conductive film. Therefore, an input pad part of the source drive IC 20 may be connected to the timing controller 50 and the power supply 60 of the circuit board 70 through the source pads and input pads of the display panel 10, and an output pad part of the source drive IC 20 may be connected to data lines through source pads of the first substrate 11.

The source drive IC 20 may be supplied with digital video data and a source timing control signal from the timing controller 50. The source drive IC 20 may convert the digital video data into data voltages and may supply the data voltages to the data lines, based on the source timing control signal.

In FIG. 3, the display device is illustrated as including one source drive IC 20, but is not limited thereto. In other embodiments, the display device may include a plurality of source drive ICs 20. In this case, the source drive ICs 20 may be respectively attached on the source pads of the first substrate (a lower substrate) 11 of the display panel 10.

The gate drive ICs 30 may be attached on the display panel 10 as the COG type. In detail, each of the gate drive ICs 30 may be implemented as an IC chip and may be directly attached on gate pads of the display panel 10 by using an anisotropy conductive film. Therefore, the gate flexible film 90 of FIG. 2 may be omitted.

An input pad part of each of the gate drive ICs 30 may be connected to, through the gate pads of the first substrate 11, LOG lines connected to the LOG pads of the first substrate 11. Therefore, each of the gate drive ICs 30 may be connected to the timing controller 50 of the circuit board 70 through the LOG lines. Also, an output pad part of each of the gate drive ICs 30 may be connected to gate lines through the gate pads of the first substrate 11.

Each of the gate drive ICs 30 may receive a gate timing control signal from the timing controller 50. The gate drive ICs 30 may generate gate signals and may supply the gate signals to the gate lines, based on the gate timing control signal.

In FIG. 3, for convenience of description, the display device is illustrated as including three gate drive ICs 30, but the number of gate drive ICs 30 is not limited thereto.

A gate driver including a plurality of TFTs may be provided instead of the gate drive ICs 30 each implemented as an IC chip as in FIGS. 2 and 3. In this case, the gate driver including the plurality of TFTs may be provided as a gate driver in panel (GIP) type in a non-display area of the first substrate 11 of the display panel 10.

Figure 4:
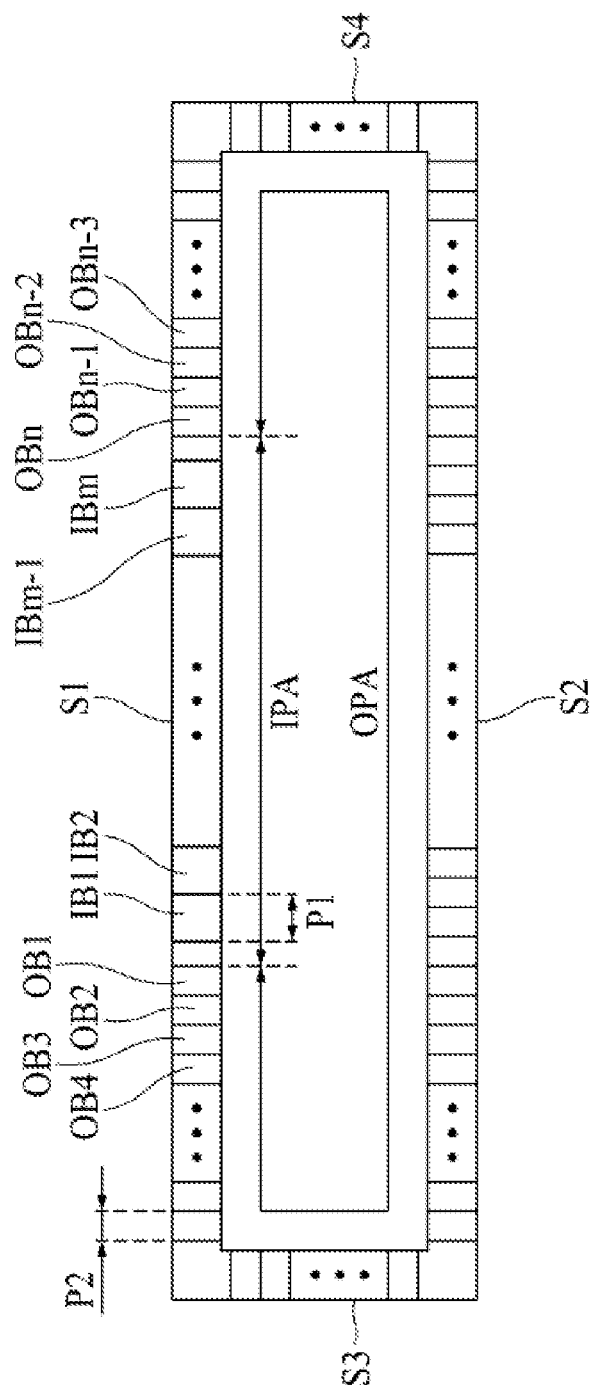
FIG. 4 is an exemplary diagram illustrating in detail a source drive IC attached as a COF type according to an embodiment of the present disclosure.

FIG. 4 is an exemplary diagram illustrating in detail a source drive IC 20 attached as the COF type according to an embodiment of the present disclosure.

Referring to FIG. 4, the source drive IC 20 attached on a source flexible film 80 as the COF type according to an embodiment of the present disclosure may include an input pad part IPA including a plurality of input bumps IB1 to IBm (where m is a positive integer equal to or more than two) and an output pad part OPA including a plurality of output bumps OB1 to OBn (where n is a positive integer equal to or more than two).

The number of output signals output from the source drive IC 20 may be larger than the number of input signals input to the source drive IC 20, and thus, the number of output bumps OB1 to OBn of the source drive IC 20 may be larger than the number of input bumps IB1 to IBm. Therefore, an area where the output bumps OB1 to Bn of the source drive IC 20 are disposed may be wider than an area where the input bumps IB1 to IBm are disposed. Also, a pitch P1 of each of the input bumps IB1 to IBm of the source drive IC 20 may be greater than a pitch P2 of each of the output bumps OB1 to OBn.

Moreover, in the COF type, even when the output bumps OB1 to OBn of the source drive IC 20 are disposed in a left portion and a right portion instead of an upper portion and a lower portion with respect to the source drive IC 20, leads of the source flexible film 80 connected to the source drive IC 20 may not interfere with leads unconnected to the source drive IC 20. Therefore, as in FIG. 4, the input bumps IB1 to IBm of the input pad part IPA of the source drive IC 20 may be disposed in a center of a first side S1 of the source drive IC 20, and the output bumps OB1 to OBn of the output pad part OPA may be disposed in both edges of the first side S1, a second side S2 facing the first side S1, a third side S3 connecting one end of the first side S1 to one end of the second side S2, and a fourth side S4 connecting the other end of the first side S1 to the other end of the second side S2 in the source drive IC 20. In FIG. 4, it is illustrated that the first side S1, the second side S2, the third side S3, and the fourth side S4 of the source drive IC 20 are an upper side, a lower side, a left side, and a right side, respectively.

Figure 5:
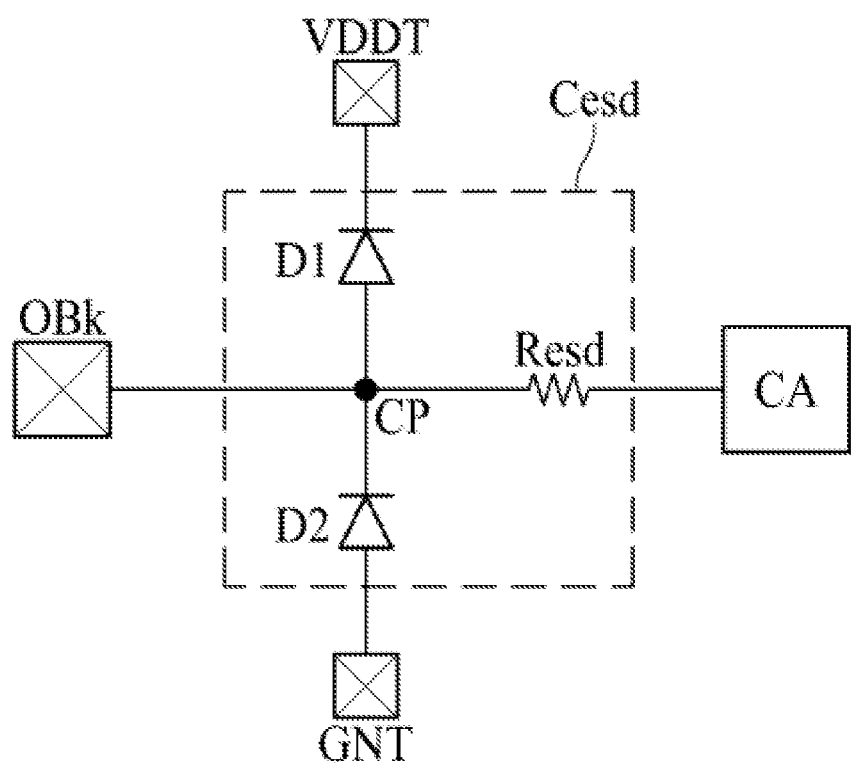
FIG. 5 is a circuit diagram illustrating in detail an electrostatic discharge (ESD) circuit connected to a $k^{th}$ output bump of a source drive IC according to an embodiment of the present disclosure.

FIG. 5 is a circuit diagram illustrating in detail an electrostatic discharge (ESD) circuit Cesd connected to a kth output bump of a source drive IC according to an embodiment of the present disclosure.

Referring to FIG. 5, the ESD circuit Cesd connected to a $k^{th}$ (where k is a positive integer satisfying 1≤k≤n) output bump OBk may include a first diode D1, a second diode D2, and a resistor Resd.

The first diode D1 may be disposed between the $k^{th}$ output bump OBk and a driving voltage input terminal VDDT. An anode of the first diode D1 may be connected to the $k^{th}$ output bump OBk, and a cathode thereof may be connected to the driving voltage input terminal VDDT. In FIG. 5, the ESD circuit Cesd is illustrated as including one first diode D1, but the present embodiment is not limited thereto. In other embodiments, a plurality of first diodes D1 serially connected to one another may be disposed between the $k^{th}$ output bump OBk and the driving voltage input terminal VDDT.

The second diode D2 may be disposed between the $k^{th}$ output bump OBk and a ground terminal GNT. An anode of the second diode D2 may be connected to the ground terminal GNT, and a cathode thereof may be connected to the $k^{th}$ output bump OBk. In FIG. 5, the ESD circuit Cesd is illustrated as including one second diode D2, but the present embodiment is not limited thereto. In other embodiments, a plurality of second diodes D2 serially connected to one another may be disposed between the $k^{th}$ output bump OBk and the ground terminal GNT.

The resistor Resd may be disposed between a core part CA and a contact point of the first diode D1 and the second diode D2. The resistor Resd may be omitted.

Positive static electricity occurring in the $k^{th}$ output bump OBk may be discharged through the first diode D1 to the driving voltage input terminal VDDT, and negative static electricity occurring in the $k^{th}$ output bump OBk may be offset by a voltage applied through the second diode D2 from the ground terminal GDN. Therefore, the core part CA of the source drive IC 20 connected to the $k^{th}$ output bump OBk may be protected from static electricity.

Figure 6:
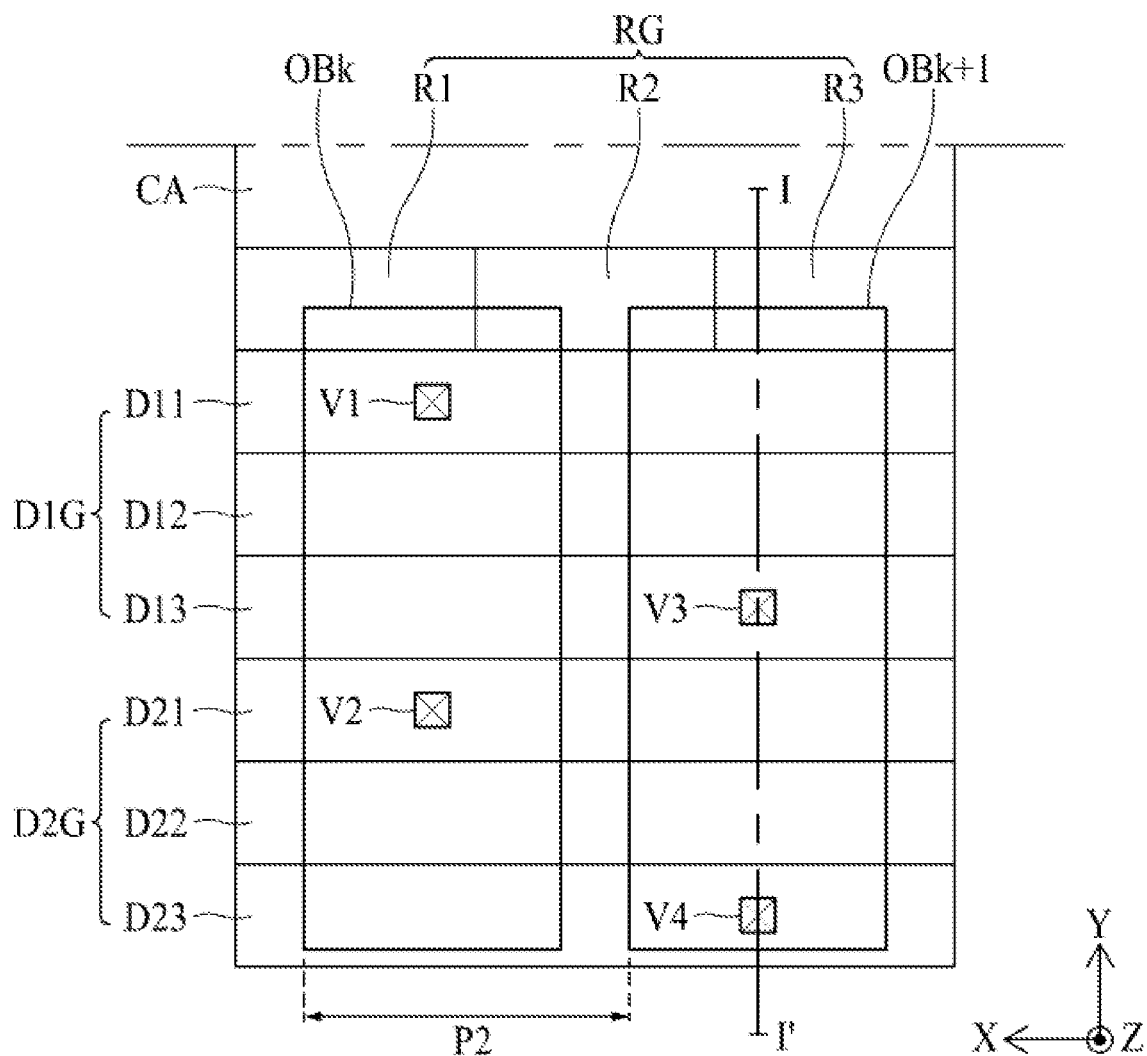
FIG. 6 is a plan view illustrating an example of an output pad part of a source drive IC when a COF type is applied.

FIG. 6 is a plan view illustrating an example of an output pad part OPA of a source drive IC 20 when a COF type is applied.

In FIG. 6, for convenience of description, only one resistor group RG, one first diode group D1G, one second diode group D2G, and $k^{th}$ and $k+1^{th}$ output bumps OBk and OBk+1 of the output pad part OPA of the source drive IC 20 are illustrated. However, the output pad part OPA of the source drive IC 20 may include a plurality of resistor groups RG, a plurality of first diode groups D1G, a plurality of second diode groups D2G, and a plurality of output bumps OB1 to OBn.

Moreover, in FIG. 6, an example where the plurality of resistor groups RG are provided in the output pad part OPA is described, but embodiments of the present disclosure are not limited thereto. In other embodiments, the plurality of resistor groups RG may be provided in another region of the source drive IC 20 instead of the output pad part OPA. Alternatively, the plurality of resistor groups RG may be omitted.

Referring to FIG. 6, the core part CA may be an area where a core connected to input bumps IB1 to IBm of an input pad part IPA is provided, wherein the core may receive input signals, generate data voltages from the input signals, and output the data voltages to the output bumps OB1 to OBn of the output pad part OPA.

The resistor group RG may include a plurality of resistor parts R1 to R3. Each of the plurality of resistor parts R1 to R3 may denote an area where the resistor Cesd of the ESD circuit Cesd of FIG. 5 is provided.

The first diode group D1G may include a plurality of first diode parts D11 to D13. Each of the plurality of first diode parts D11 to D13 may denote an area where the first diode D1 of the ESD circuit Cesd of FIG. 5 is provided.

The second diode group D2G may include a plurality of second diode parts D21 to D23. Each of the plurality of second diode parts D21 to D23 may denote an area where the second diode D2 of the ESD circuit Cesd of FIG. 5 is provided.

The number of resistor parts R1 to R3 included in the resistor group RG, the number of first diode parts D11 to D13 included in the first diode group D1G, and the number of second diode parts D21 to D23 included in the second diode group D2G may be the same as in FIG. 6, but are not limited thereto. In other embodiments, the number of resistor parts included in the resistor group RG, the number of first diode parts included in the first diode group D1G, and the number of second diode parts included in the second diode group D2G may differ.

Moreover, in the COF type, the number of resistor parts R1 to R3 of the resistor group RG, the number of first diode parts D11 to D13 of the first diode group D1G, and the number of second diode parts D21 to D23 of the second diode group D2G in the source drive IC 20 may be larger than the number of output bumps OBk and OBk+1 overlapping the resistor group RG, the first diode parts D11 to D13 of the first diode group D1G, and the second diode parts D21 to D23 of the second diode group D2G of the source drive IC 20.

Moreover, as in FIG. 5, in the COF type, the output bumps OB1 to OBn of the source drive IC 20 may be disposed in the both edges of the first side S1, the third side S3, and the fourth side S4 as well as the second side S2. That is, a same number of output bumps OB1 to OBn may be disposed in a narrower area in the COG type than the COF type. Therefore, a pitch P2 of each output bump of the source drive IC 20 attached as the COF type as in FIG. 6 may be greater than a pitch P4 of each output bump of a source drive IC 20 attached as the COG type as in FIG. 10. Thus, in order for the source drive IC 20 to be applied to all of the COF type and the COG type, the number of resistor parts R1 to R3 of the resistor group RG, the number of first diode parts D11 to D13 of the first diode group D1G, and the number of second diode parts D21 to D23 of the second diode group D2G in the source drive IC 20 using the COF type as in FIG. 6 should be designed at least equal to the number of output bumps OBk, OBk+1, and OBk+2 overlapping a resistor group RG, a first diode group D1G, and a second diode group D2G of a source drive IC 20 using the COG type as in FIG. 11. Accordingly, the number of output bumps OBk, OBk+1, and OBk+2 overlapping the resistor group RG, the first diode group D1G, and the second diode group D2G of the source drive IC 20 using the COG type as in FIG. 11 may be larger than the number of output bumps OBk and OBk+1 overlapping the resistor group RG, the first diode group D1G, and the second diode group D2G of the source drive IC 20 using the COF type as in FIG. 6.

Moreover, in FIG. 6, it is illustrated that the resistor group RG includes three resistor parts R1 to R3, the first diode group D1G includes three first diode parts D11 to D13, and the second diode group D2G includes three second diode parts D21 to D23, but the present embodiment is not limited thereto. Also, in FIG. 6, it is illustrated that two output bumps OBk and OBk+1 overlap the resistor group RG, the first diode group D1G, and the second diode group D2G, but the present embodiment is not limited thereto.

The $k^{th}$ output bump OBk may be connected to at least one of the plurality of first diode parts D11 to D13 and at least one of the plurality of second diode parts D21 to D23. The $k+1^{th}$ output bump OBk+1 adjacent to the $k^{th}$ output bump OBk may be connected to at least one of the plurality of first diode parts D11 to D13 unconnected to the kth output bump OBk and at least one of the plurality of second diode parts D21 to D23 unconnected to the $k^{th}$ output bump OBk. For example, as in FIG. 6, the $k^{th}$ output bump OBk may be connected to a $1\text{-}1^{th}$ diode part D11 and a $2\text{-}1^{th}$ diode part D21. The $k^{th}$ output bump OBk may be connected to the $1\text{-}1^{th}$ diode part D11 through a first via V1 and may be connected to the $2\text{-}1^{th}$ diode part D21 through a second via V2. Also, the $k+1^{th}$ output bump OBk+1 may be connected to a $1\text{-}3^{th}$ diode part D13 and a $2\text{-}3^{th}$ diode part D23. The $k+1^{th}$ output bump OBk+1 may be connected to the $1\text{-}3^{th}$ diode part D13 through a third via V3 and may be connected to the $2\text{-}3^{th}$ diode part D23 through a fourth via V4.

Each of the plurality of first diode parts D11 to D13 and each of the plurality of second diode parts D21 to D23 may be long provided in a first direction (an X-axis direction), and in this case, each of the $k^{th}$ output bump OBk and the $k+1^{th}$ output bump OBk+1 may be long provided in a second direction (a Y-axis direction) intersecting the first direction (the X-axis direction).

FIGS. 7A to 7D are cross-sectional views illustrating embodiments of a cross-sectional surface taken along line I-I' of FIG. 6.

Referring to FIGS. 7A to 7D, a core part CA, one of a plurality of resistor parts R1 to R3, a plurality of first diode parts D11 to D13, and a plurality of second diode parts D21 to D23 may be sequentially arranged on a base film BF in a second direction (a Y-axis direction).

Figure 7A:
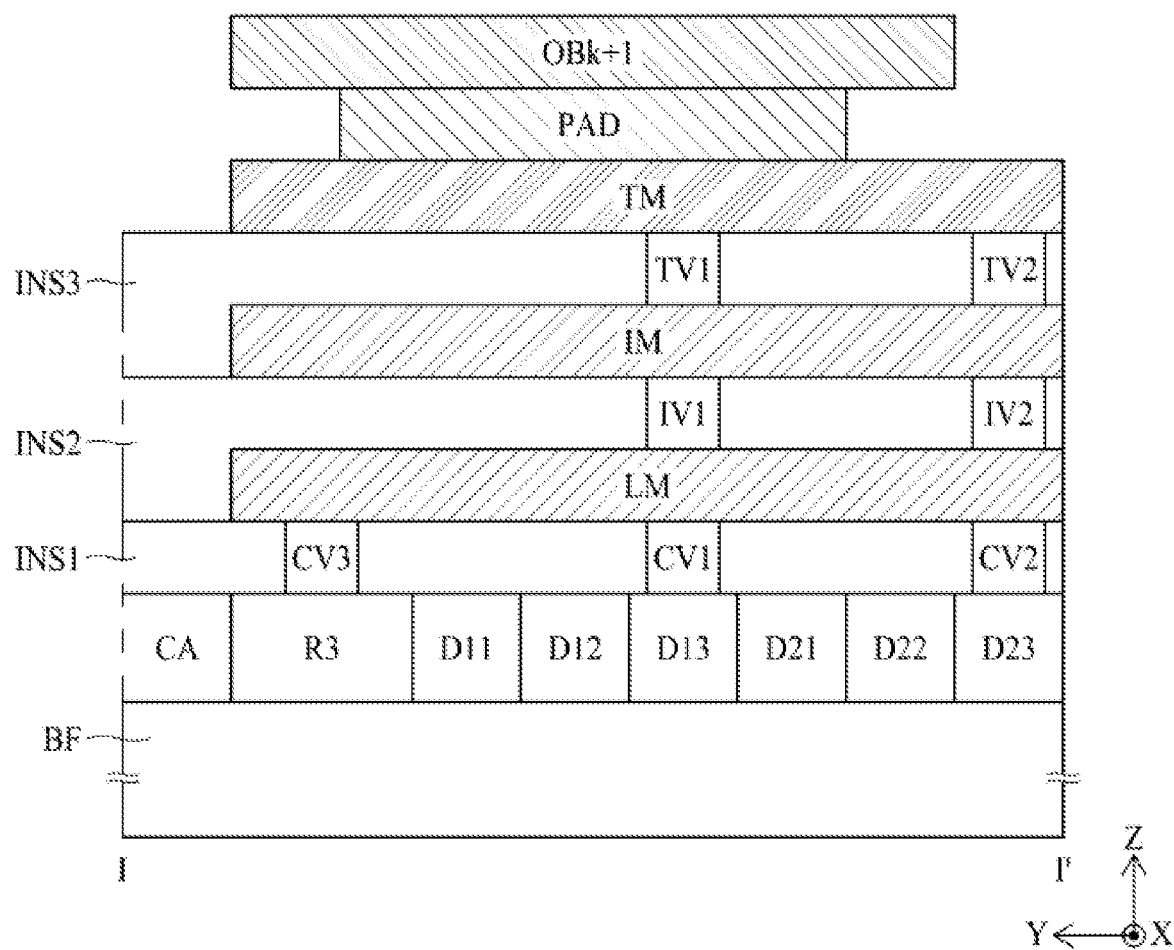
FIGS. 7A, 7B, 7C and 7D are cross-sectional views illustrating embodiments of a cross-sectional surface taken along line I-I' of FIG. 6.

Referring to FIG. 7A, a first insulation layer INS1 may be provided on the core part CA, one of the plurality of resistor parts R1 to R3, the plurality of first diode parts D11 to D13, and the plurality of second diode parts D21 to D23. In FIG. 7A, it is illustrated that a contact point CP of one of the plurality of resistor parts R1 to R3, one of the plurality of first diode parts D11 to D13, and one of the plurality of second diode parts D21 to D23 is provided on a lower metal layer LM.

A third resistor part R3, a $1\text{-}3^{th}$ diode part D13, and a $2\text{-}3^{th}$ diode part D23 each connected to an $k+1^{th}$ output bump OBk+1 may be connected to a first contact via CV1, a second contact via CV2, and a third contact via CV3 each filled into a region from which the first insulation layer INS1 is removed. In detail, the first contact via CV1 may be filled into a hole which passes through the first insulation layer INS1 to expose the $1\text{-}3^{th}$ diode part D13, the second contact via CV2 may be filled into a hole which passes through the first insulation layer INS1 to expose the $2\text{-}3^{th}$ diode part D23, and the third contact via CV3 may be filled into a hole which passes through the first insulation layer INS1 to expose the third resistor part R3. The first contact via CV1, the second contact via CV2, and the third contact via CV3 may each include a metal material.

The lower metal layer LM may be provided on the first insulation layer INS1. The lower metal layer LM may be connected to the first contact via CV1, the second contact via CV2, and the third contact via CV3. The lower metal layer LM may be connected to one of the plurality of first diode parts D11 to D13 through the first contact via CV1, connected to one of the plurality of second diode parts D21 to D23 through the second contact via CV2, and connected to one of the plurality of resistor parts R1 to R3 through the third contact via CV3, and thus, the lower metal layer LM may correspond to the contact point CP of FIG. 5.

A second insulation layer INS2 may be provided on the lower metal layer LM. The lower metal layer LM may be connected to a first intermediate via IV1 and a second intermediate via IV1 each filled into a region from which the second insulation layer INS2 is removed. In detail, the first intermediate via IV1 may be filled into a hole which passes through the second insulation layer INS2 to expose the lower metal layer LM, and the second intermediate via IV2 may be filled into a hole which passes through the second insulation layer INS2 to expose the lower metal layer LM. The first intermediate via IV1 may be provided on the first contact via CV1, and the second intermediate via IV2 may be provided on the second contact via CV2. The first intermediate via IV1 and the second intermediate via IV2 may each include a metal material.

An intermediate metal layer IM may be provided on the second insulation layer INS2. The intermediate metal layer IM may be connected to the first intermediate via IV1 and the second intermediate via IV2. A third insulation layer INS3 may be provided on the intermediate metal layer IM.

The intermediate metal layer IM may be connected to a first top via TV1 and a second top via TV2 each filled into a region from which the third insulation layer INS3 is removed. In detail, the first top via TV1 may be filled into a hole which passes through the third insulation layer INS3 to expose the intermediate metal layer IM, and the second top via TV2 may be filled into a hole which passes through the third insulation layer INS3 to expose the intermediate metal layer IM. The first top via TV1 may be provided on the first contact via CV1, and the second top via TV2 may be provided on the second contact via CV2. The first top via TV1 and the second top via TV2 may each include a metal material.

A top metal layer TM may be provided on the third insulation layer INS3. The top metal layer TM may be connected to the first top via TV1 and the second top via TV2.

A pad may be provided on the top metal layer TM. The pad may include a metal material.

The $k+1^{th}$ output bump OBk+1 may be provided on the pad. The $k+1^{th}$ output bump OBk+1 may include a metal material. The $k+1^{th}$ output bump OBk+1 may be connected to the top metal layer TM through the pad.

Figure 7B:
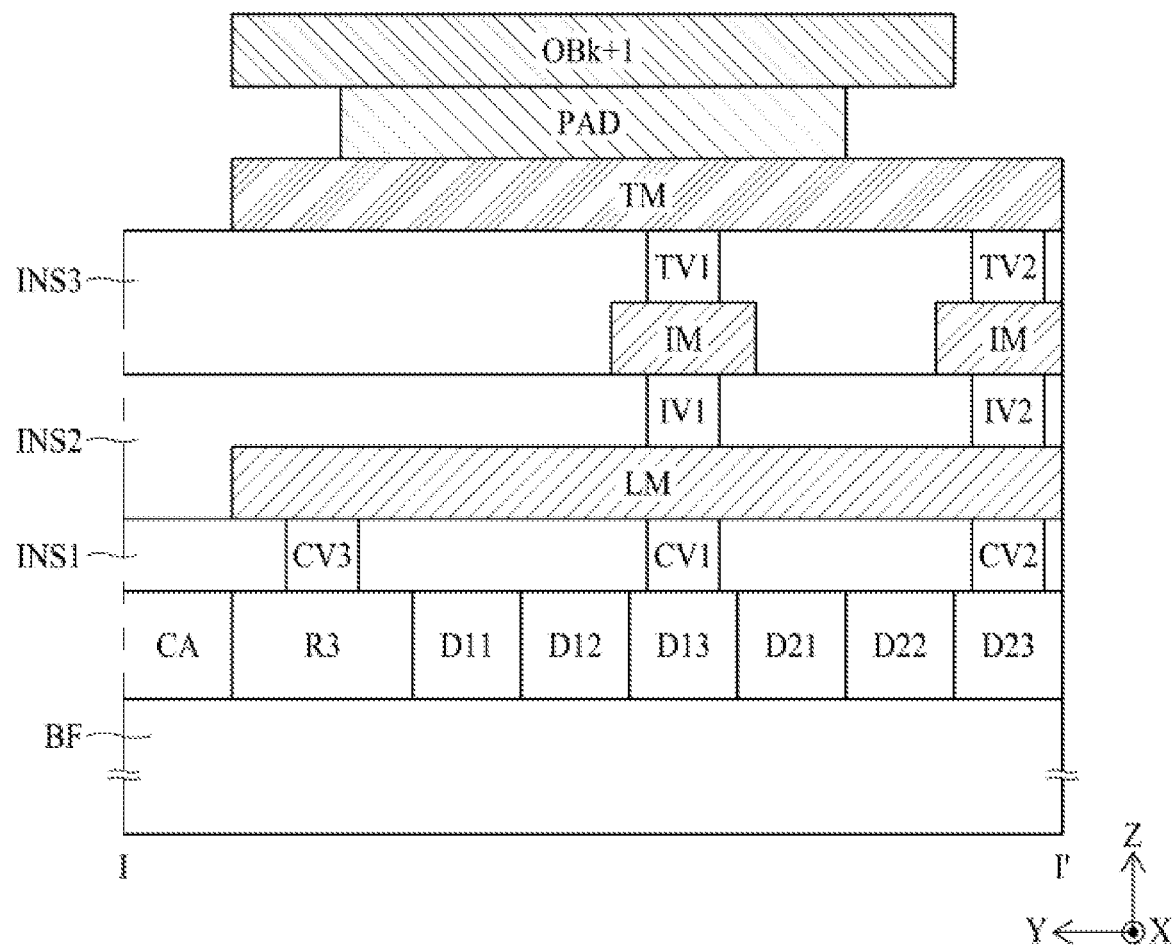

Except for that an intermediate metal layer IM is patterned, the illustration of FIG. 7B is substantially the same as the illustration of FIG. 7A. In FIG. 7B, description overlapping the illustration of FIG. 7A is omitted.

Referring to FIG. 7B, each of an intermediate metal layer IM connected to a first intermediate via TV1 and an intermediate metal layer IM connected to a second intermediate via TV2 may be provided on a second insulation layer INS2. That is, a plurality of intermediate metal layers IM may be patterned and provided on the second insulation layer INS2, and a third insulation layer INS3 may be provided on the plurality of intermediate metal layers IM.

Figure 7C:
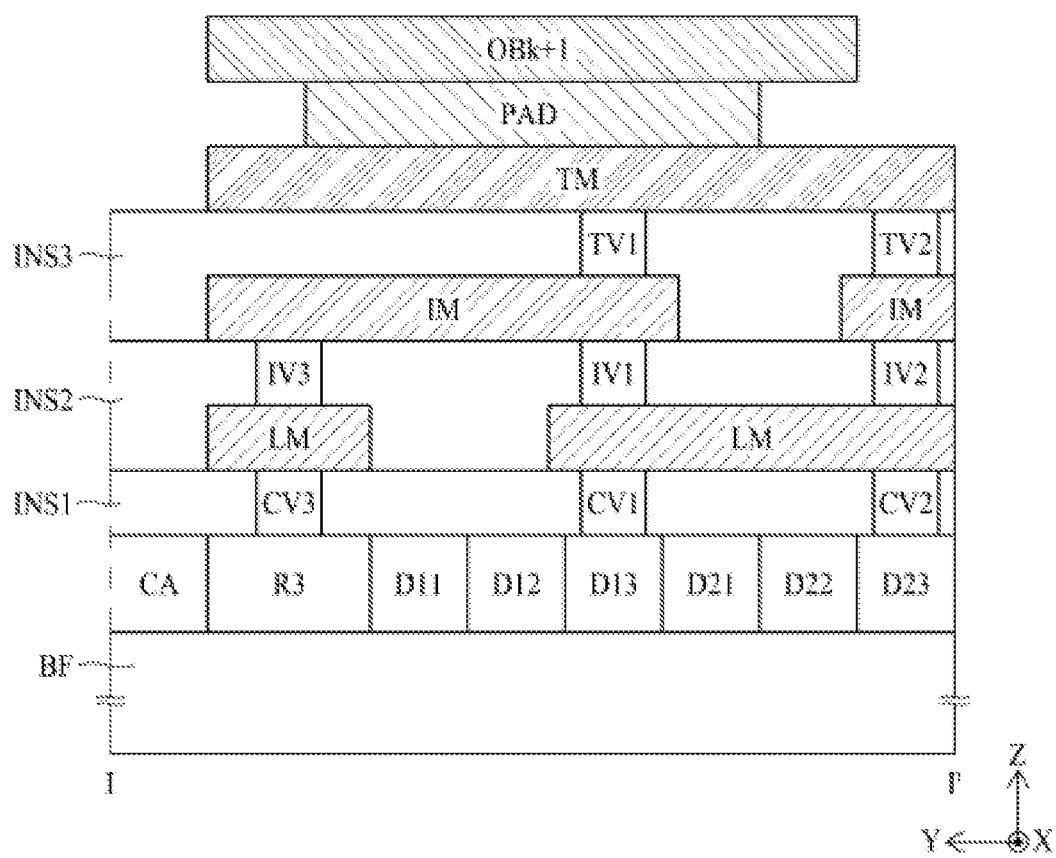

In FIG. 7C, it is illustrated that a contact point CP of one of a plurality of resistor parts R1 to R3, one of a plurality of first diode parts D11 to D13, and one of a plurality of second diode parts D21 to D23 is provided on an intermediate metal layer IM. In FIG. 7C, description overlapping the illustration of FIG. 7A is omitted.

Referring to FIG. 7C, a lower metal layer LM connected to a first contact via CV1 and a second contact via CV2 and a lower metal layer LM connected to a third contact via CV3 may be provided on the first insulation layer INS1. That is, a plurality of lower metal layers LM may be patterned and provided on the first insulation layer INS1. The lower metal layer LM may be connected to one of the plurality of first diode parts D11 to D13 through the first contact via CV1 and one of the plurality of second diode parts D21 to D23 through the second contact via CV2, and thus, the lower metal layer LM may correspond to a contact point of one of the plurality of first diode parts D11 to D13 and one of the plurality of second diode parts D21 to D23.

A second insulation layer INS2 may be provided on the lower metal layers LM. The lower metal layer LM connected to the third contact via CV3 may be connected to a third intermediate via IV3. The third intermediate via IV3 may be filled into a hole which passes through the second insulation layer INS2 to expose the lower metal layer LM.

An intermediate metal layer IM connected to a first intermediate via IV1 and an intermediate metal layer IM connected to a second intermediate via IV2 and a third intermediate via IV3 may be provided on the second insulation layer INS2. That is, a plurality of intermediate metal layers IM may be patterned and provided on the second insulation layer INS2. Each of the intermediate metal layers IM may be connected to a lower metal layer LM connected to one of the plurality of first diode parts D11 to D13 and one of the plurality of second diode parts D21 to D23 through a second contact via CV2 and may be connected to a lower metal layer LM connected to one of the plurality of resistor parts R1 to R3 through a third contact via CV3. Therefore, each of the intermediate metal layers IM may correspond to a contact point CP of one of the plurality of resistor parts R1 to R3, one of the plurality of first diode parts D11 to D13, and one of the plurality of second diode parts D21 to D23. A third insulation layer INS3 may be provided on the plurality of intermediate metal layers IM.

Figure 7D:
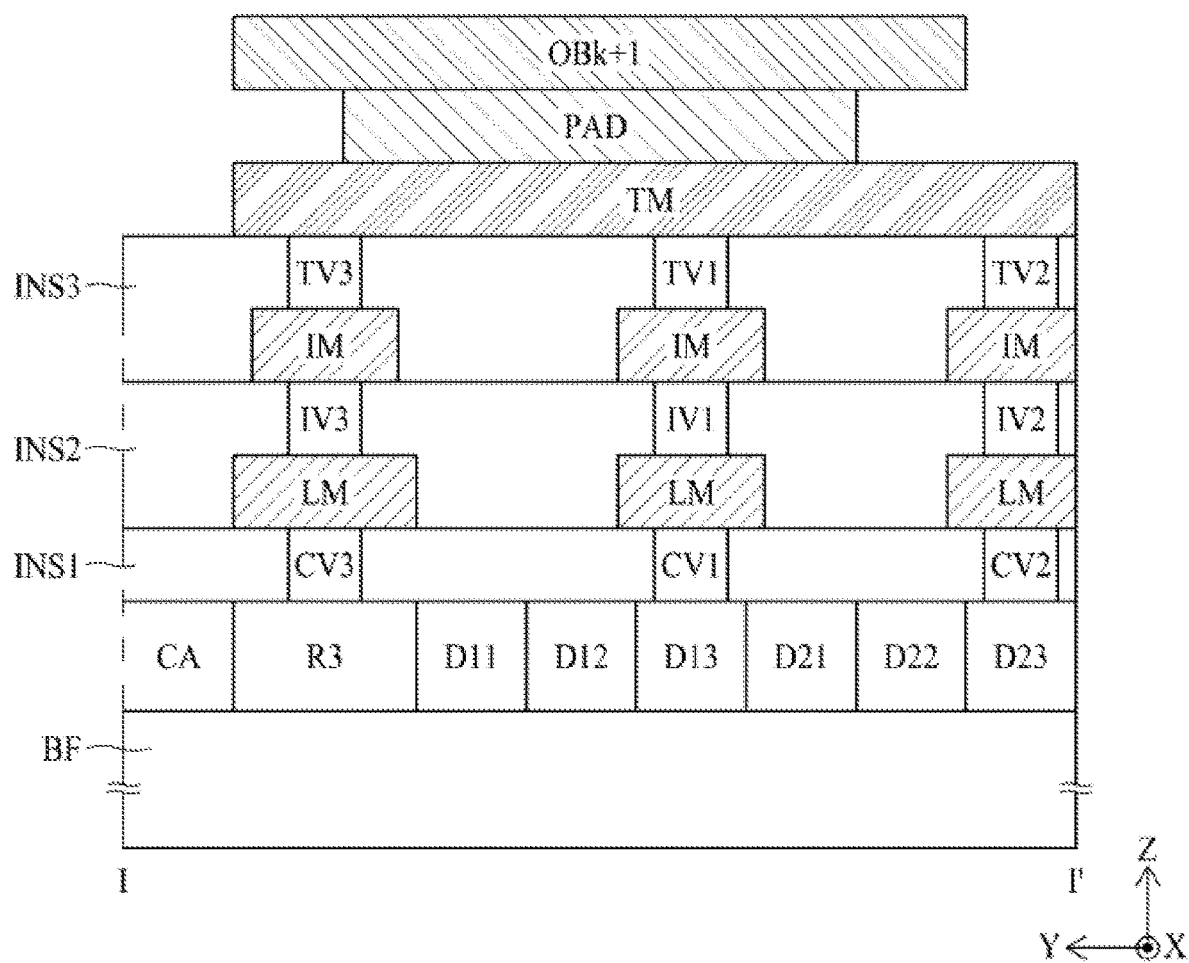

In FIG. 7D, it is illustrated that a contact point CP of one of a plurality of resistor parts R1 to R3, one of a plurality of first diode parts D11 to D13, and one of a plurality of second diode parts D21 to D23 is provided on a top metal layer TM. In FIG. 7D, description overlapping the illustration of FIG. 7A is omitted.

Referring to FIG. 7D, a lower metal layer LM connected to a first contact via CV1, a lower metal layer LM connected to a second contact via CV2, and a lower metal layer LM connected to a third contact via CV3 may be provided on a first insulation layer INS1. That is, a plurality of lower metal layers LM may be patterned and provided on the first insulation layer INS1.

A second insulation layer INS2 may be provided on the plurality of lower metal layers LM. The lower metal layer LM connected to the third contact via CV3 may be connected to a third intermediate via IV3. The third intermediate via IV3 may be filled into a hole which passes through the second insulation layer INS2 to expose the lower metal layer LM.

An intermediate metal layer IM connected to a first intermediate via IV1, an intermediate metal layer IM connected to a second intermediate via IV2, and an intermediate metal layer IM connected to the third intermediate via IV3 may be provided on the second insulation layer INS2. That is, a plurality of intermediate metal layers IM may be patterned and provided on the second insulation layer INS2.

A third insulation layer INS3 may be provided on the plurality of intermediate metal layers IM. An intermediate metal layer IM connected to the third intermediate via IV3 may be connected to a third top via TV3. The third top via TV3 may be filled into a hole which passes through the third insulation layer INS3 to expose the intermediate metal layer IM.

A top metal layer TM may be provided on the third insulation layer INS3. The top metal layer TM may be connected to the first top via TV1, the second top via TV2, and the third top via TV3. The top metal layer TM may be connected to one of a plurality of first diode parts D11 to D13 through the first top via TV1, connected to one of a plurality of second diode parts D21 to D23 through the second top via TV2, and connected to one of a plurality of resistor parts R1 to R3 through the third top via TV3. Therefore, the top metal layer TM may correspond to the contact point CP of FIG. 5.

Except for that a first contact via CV1, a first intermediate via IV1, a first top via IV1, and a first via V1 are provided on a 1-1$^{th}$ diode part D11, a second contact via CV2, a second intermediate via IV2, a second top via IV2, and a second via V2 are provided on a 2-1$^{th}$ diode part D21, and a third contact via CV3 is provided on a third resistor part R3, a cross-sectional view where a k$^{th}$ output bump OBk is connected to the 1-1$^{th}$ diode part D11, the 2-1$^{th}$ diode part D21, and the first resistor part R1 may be illustrated substantially identical to FIGS. 7A to 7D. Therefore, a cross-sectional view where a k$^{th}$ output bump OBk is connected to the 1-1$^{th}$ diode part D11, the 2-1$^{th}$ diode part D21, and the first resistor part R1 is omitted.

Figure 8:
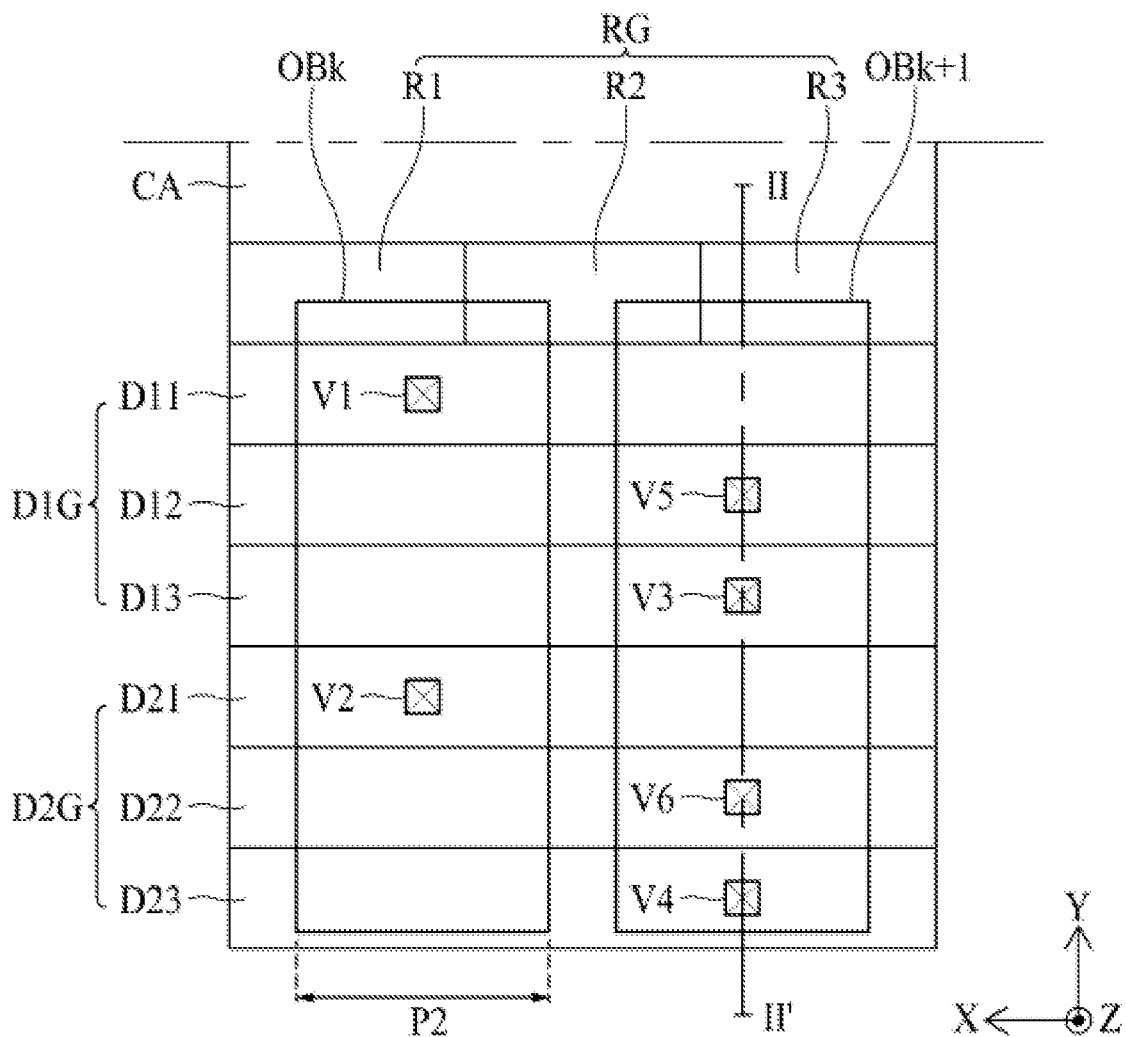
FIG. 8 is a plan view illustrating another example of an output pad part of a source drive IC when a COF type is applied.

FIG. 8 is a plan view illustrating another example of an output pad part of a source drive IC when a COF type is applied.

In FIG. 8, for convenience of description, only one resistor group RG, one first diode group D1G, one second diode group D2G, and k$^{th}$ and k+1$^{th}$ output bumps OBk and OBk+1, overlapping the groups, of the output pad part of the source drive IC are illustrated. However, the output pad part of the source drive IC may include a plurality of resistor groups RG, a plurality of first diode groups D1G, a plurality of second diode groups D2G, and a plurality of output bumps OB1 to OBn. In FIG. 8, description overlapping the illustration of FIG. 6 is omitted.

Referring to FIG. 8, the k$^{th}$ output bump OBk may be connected to at least one of a plurality of first diode parts D11 to D13 and at least one of a plurality of second diode parts D21 to D23. The k+1$^{th}$ output bump OBk+1 adjacent to the k$^{th}$ output bump OBk may be connected to at least one of the plurality of first diode parts D11 to D13 unconnected to the k$^{th}$ output bump OBk and at least one of the plurality of second diode parts D21 to D23 unconnected to the k$^{th}$ output bump OBk.

Particularly, one of the k$^{th}$ output bump OBk and the k+1$^{th}$ output bump OBk+1 may be connected to at least two of the plurality of first diode parts D11 to D13 and at least two of the plurality of second diode parts D21 to D23. In the COF type, the number of resistor parts R1 to R3, the number of first diode parts D11 to D13, and the number of second diode parts D21 to D23 in the source drive IC 20 may be larger than the number of output bumps. Therefore, when one of the k$^{th}$ output bump OBk and the k+1$^{th}$ output bump OBk+1 is connected to one resistor part, one first diode part, and one second diode part, the other output bump may be connected to at least two resistor parts, at least two first diode parts, and at least two second diode parts.

For example, as in FIG. 8, the k+1$^{th}$ output bump OBk+1 may be connected to a 1-2$^{th}$ diode part D12 and a 1-3$^{th}$ diode part D13 of the plurality of first diode parts D11 to D13 and a 2-2$^{th}$ diode part D22 and a 2-3$^{th}$ diode part D23 of the plurality of second diode parts D21 to D23. The k+1$^{th}$ output bump OBk+1 may be connected to the 1-3$^{th}$ diode part D13 through a third via V3, connected to the 2-3$^{th}$ diode part D23 through a fourth via V4, connected to the 1-2$^{th}$ diode part D12 through a fifth via V5, and connected to the 2-2$^{th}$ diode part D22 through a sixth via V6.

Figure 9:
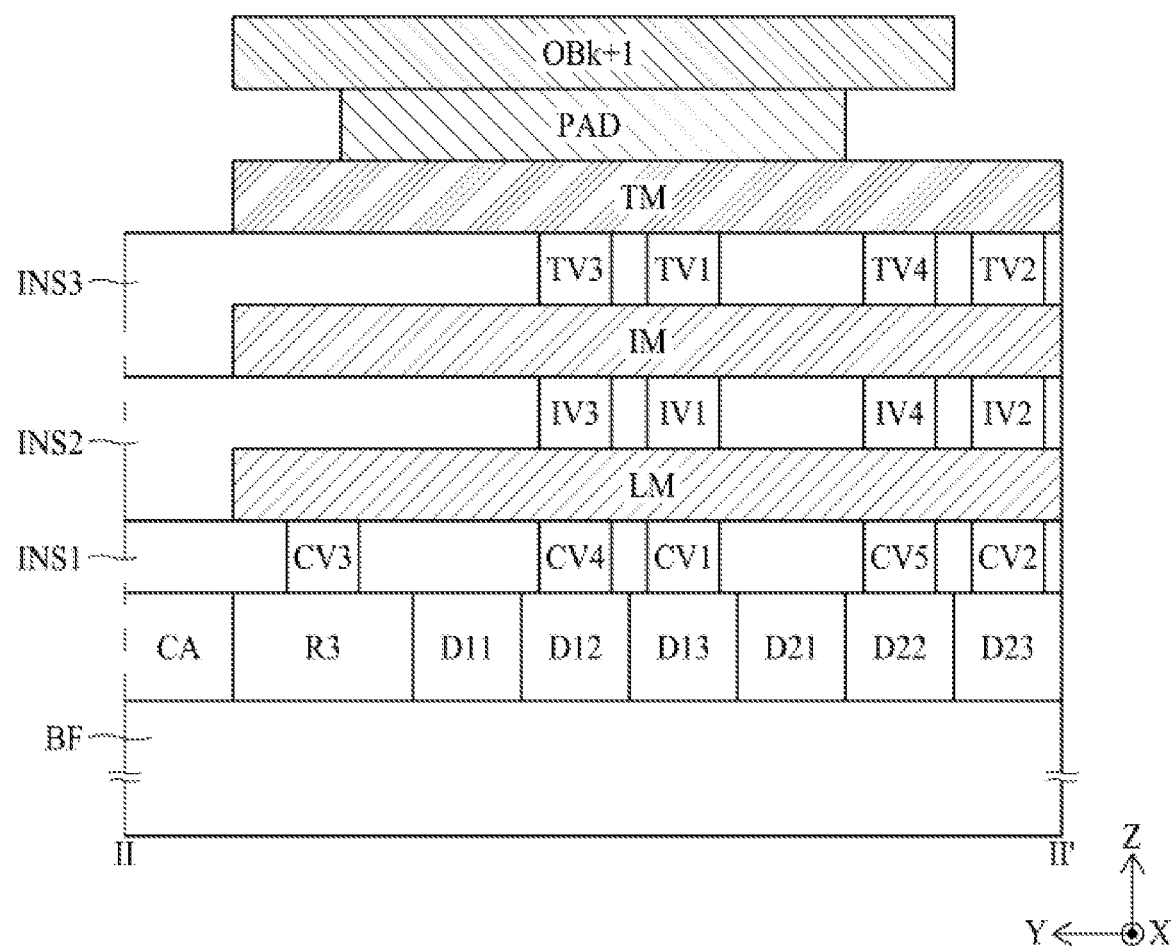
FIG. 9 is a cross-sectional view illustrating an example of a cross-sectional surface taken along line II-II' of FIG. 8.

FIG. 9 is a cross-sectional view illustrating an example of a cross-sectional surface taken along line II-II' of FIG. 8.

In FIG. 9, it is illustrated that a contact point CP of one of a plurality of resistor parts R1 to R3, one of a plurality of first diode parts D11 to D13, and one of a plurality of second diode parts D21 to D23 is provided on a lower metal layer LM.

Except for that a fourth contact via CV4, a third intermediate via IV3, a third top via TV3, and a fifth via V5 are further provided on a 1-2$^{th}$ diode part D12 and a fifth contact via CV5, a fourth intermediate via IV4, a fourth top via TV4, and a fourth via V4 are further provided on a 2-2$^{th}$ diode part D22, the cross-sectional view illustrated in FIG. 9 is substantially the same as the illustration of FIG. 7A. Therefore, a detailed description of FIG. 9 is omitted.

Moreover, the cross-sectional view taken along line II-II' of FIG. 8 is not limited thereto. That is, in FIG. 9, it is illustrated that an intermediate metal layer IM is connected to both a first intermediate via IV1 and a second intermediate via IV2, but as in FIG. 7C, the intermediate metal layer IM connected to the first intermediate via IV1 and the intermediate metal layer IM connected to the second intermediate via IV2, namely, a plurality of intermediate metal layers IM, may be patterned and provided. Also, in FIG. 9, an example where a contact point CP of one of the plurality of resistor parts R1 to R3, one of the plurality of first diode parts D11 to D13, and one of the plurality of second diode parts D21 to D23 is provided on a lower metal layer LM is described, but the contact point CP may be provided on the intermediate metal layer IM as in FIG. 7 and the contact point CP may be provided on the top metal layer TM as in FIG. 7D.

Figure 10:
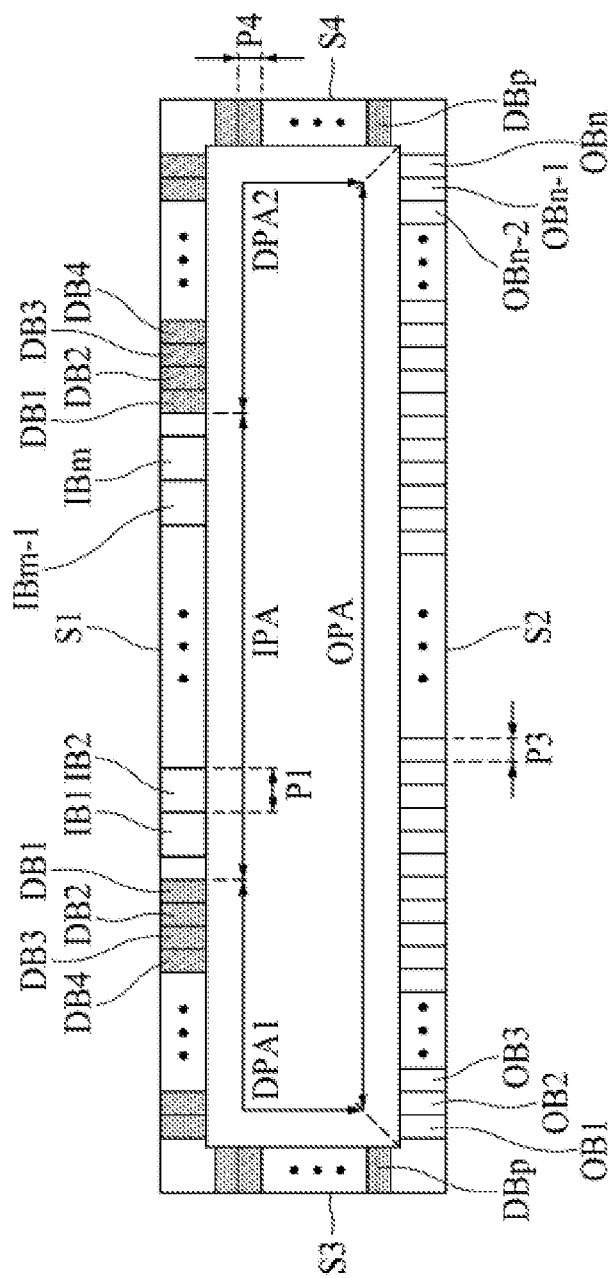
FIG. 10 is an exemplary diagram illustrating in detail a source drive IC attached as a COG type, according to an embodiment of the present disclosure.

FIG. 10 is an exemplary diagram illustrating in detail a source drive IC 20 attached as the COG type, according to an embodiment of the present disclosure.

Referring to FIG. 10, the source drive IC 20 directly attached on a first substrate 11 as the COG type according to an embodiment of the present disclosure may include an input pad part IPA including a plurality of input bumps IB1 to IBm (where m is a positive integer equal to or more than two), an output pad part OPA including a plurality of output bumps OB1 to OBn (where n is a positive integer equal to or more than two), and first and second dummy pad parts DPA1 and DPA2 each including a plurality of dummy bumps DB1 to DBp (where p is a positive integer equal to or more than two).

In each of the first and second dummy pad parts DPA1 and DPA2, an ESD circuit Cesd connected to a q$^{th}$ dummy bump DBq (where q is a positive integer satisfying 1≤q≤p) may be configured so as not to operate in circuit. For example, an anode and a cathode of each of a first dummy diode and a second dummy diode of the ESD circuit Cesd connected to the $q^{th}$ dummy bump DBq may be floated, or the same voltage may be applied to the anode and the cathode of each of the first dummy diode and the second dummy diode. Also, a dummy resistor of the ESD circuit Cesd connected to the $q^{th}$ dummy bump DBq may not be connected to a contact point CP.

The number of output signals output from the source drive IC 20 may be larger than the number of input signals input to the source drive IC 20, and thus, the number of output bumps OB1 to OBn of the source drive IC 20 may be larger than the number of input bumps IB1 to IBm. Therefore, an area where the output bumps OB1 to OBn of the source drive IC 20 are disposed may be wider than an area where the input bumps IB1 to IBm are disposed. Also, a pitch P1 of each of the input bumps IB1 to IBm of the source drive IC 20 may be greater than a pitch P3 of each of the output bumps OB1 to OBn.

Moreover, in the COF type, even when the output bumps OB1 to OBn of the source drive IC 20 are disposed in a left portion and a right portion instead of an upper portion and a lower portion with respect to the source drive IC 20, leads of the first substrate 11 connected to the source drive IC 20 may interfere with leads unconnected to the source drive IC 20. Therefore, as in FIG. 10, the input bumps IB1 to IBm of the input pad part IPA of the source drive IC 20 may be disposed in a center of a first side S1 of the source drive IC 20, the output bumps OB1 to OBn of the output pad part OPA may be disposed in a second side S2 of the source drive IC 20 facing the first side S1, and the dummy bumps DB1 to DBp of each of the first and second dummy pad parts DPA1 and DPA2 may be disposed in both edges of the first side S1, a third side S3 connecting one end of the first side S1 to one end of the second side S2, and a fourth side S4 connecting the other end of the first side S1 to the other end of the second side S2 in the source drive IC 20. In FIG. 10, it is illustrated that the first side S1, the second side S2, the third side S3, and the fourth side S4 of the source drive IC 20 are an upper side, a lower side, a left side, and a right side, respectively.

As in FIG. 4, in the COF type, the output bumps of the output pad part OPA of the source drive IC 20 may be disposed in the both edges, where the input bumps IB1 to IBm of the input pad part IPA are disposed, of the first side S1 as well as the third side S3 and the fourth side S4 respectively corresponding to a left side and a right side of the source drive IC 20. Therefore, in the COF type, bumps disposed in the both edges of the first side S1, the third side S3, and the fourth side S4 of the source drive IC 20 may be provided as output bumps.

On the other hand, as in FIG. 10, in the COG type, the output bumps of the output pad part OPA may be disposed in only the second side S2 of the source drive IC 20. Therefore, in the COG type, bumps disposed in the both edges of the first side S1, the third side S3, and the fourth side S4 of the source drive IC 20 may be provided as the dummy bumps DB1 to DBp. A pitch P4 of each of the dummy bumps of the source drive IC 20 may be substantially the same as a pitch P3 of each of the output bumps.

As described above, in an embodiment of the present disclosure, each of the bumps disposed in the both edges of the first side S1, the third side S3, and the fourth side S4 of the source drive IC 20 may be provided as one of an output bump and a dummy bump, based on whether the source drive IC 20 is attached as the COF type or the COG type. That is, in an embodiment of the present disclosure, only a design of each of the bumps disposed in the both edges of the first side S1, the third side S3, and the fourth side S4 of the source drive IC 20 may be modified based on the COF type or the COG type. Accordingly, in an embodiment of the present disclosure, the source drive IC 20 capable of being applied to all of the COF type and the COF type may be provided.

Figure 11:
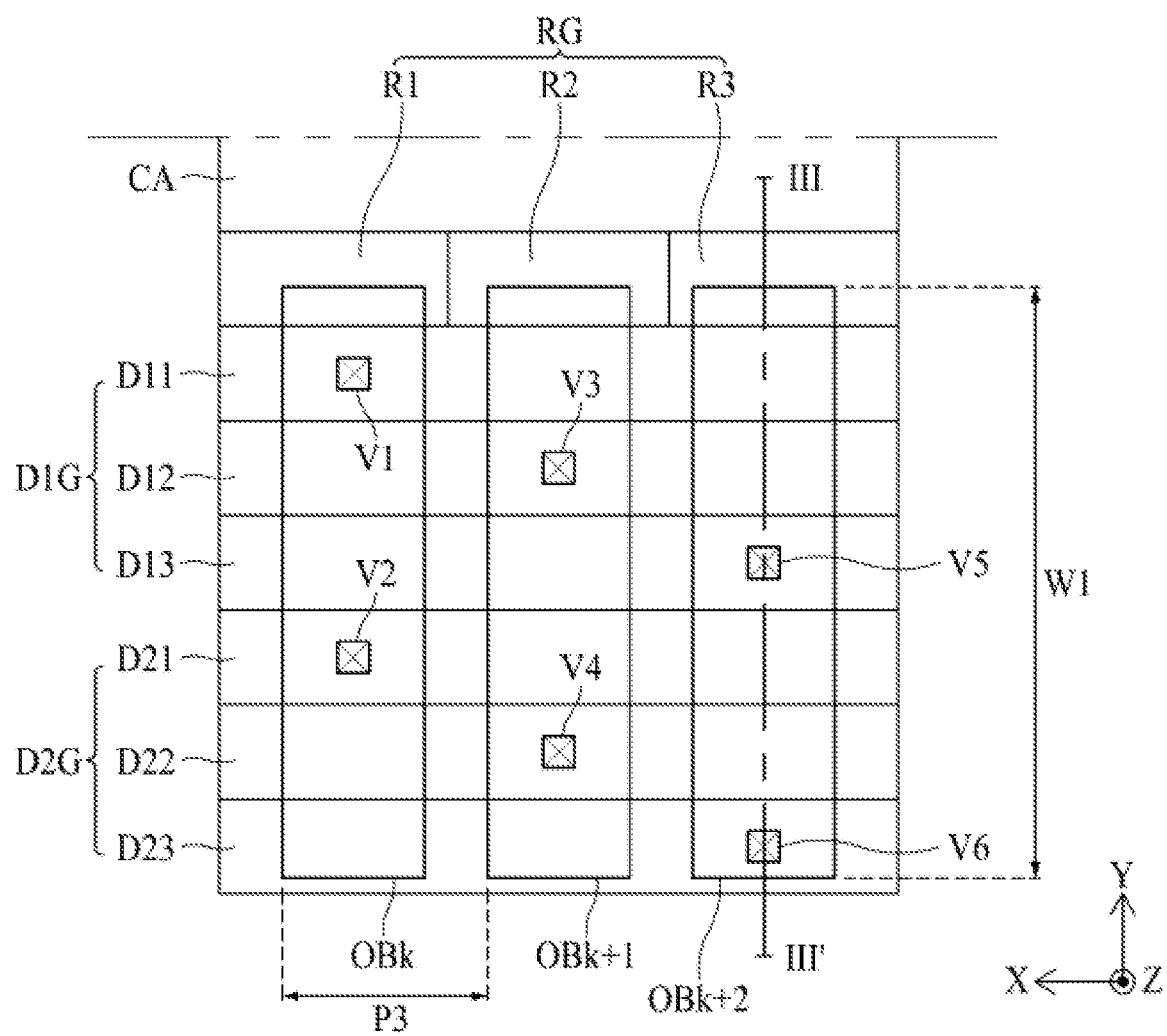
FIG. 11 is a plan view illustrating an example of an output pad part of a source drive IC when a COG type is applied.

FIG. 11 is a plan view illustrating an example of an output pad part OPA of a source drive IC 20 when the COG type is applied.

In FIG. 11, for convenience of description, only one resistor group RG, one first diode group D1G, one second diode group D2G, and $k^{th}$, $k+1^{th}$, and $k+2^{th}$ output bumps OBk, OBk+1, and OBk+2, overlapping the groups, of the output pad part OPA of the source drive IC 20 are illustrated. However, the output pad part OPA of the source drive IC 20 may include a plurality of resistor groups RG, a plurality of first diode groups D1G, a plurality of second diode groups D2G, and a plurality of output bumps OB1 to OBn.

A core part CA, a plurality of resistor parts R1 to R3 of the resistor group RG, a plurality of first diode parts D11 to D13 of the first diode group D1G, and a plurality of second diode parts D21 to D23 of the second diode group D2G illustrated in FIG. 11 are substantially the same as described above with reference to FIG. 6, and thus, their detailed descriptions are omitted.

Moreover, in the COG type, the number of resistor parts R1 to R3 of the resistor group RG, the number of first diode parts D11 to D13 of the first diode group D1G, and the number of second diode parts D21 to D23 of the second diode group D2G in the source drive IC 20 may be equal to or larger than the number of $k^{th}$ and $k+1^{th}$ output bumps OBk and OBk+1 overlapping the resistor group RG, the first diode group D1G, and the second diode group D2G. However, as the number of resistor parts R1 to R3, the number of first diode parts D11 to D13, and the number of second diode parts D21 to D23 increase, a width W1 of the output pad part OPA in a second direction (a Y-axis direction) may be widened. Therefore, considering the width W1 of the output pad part OPA in the second direction (the Y-axis direction), the number of resistor parts R1 to R3 of the resistor group RG, the number of first diode parts D11 to D13 of the first diode group D1G, and the number of second diode parts D21 to D23 of the second diode group D2G in the source drive IC 20 may be the same as the number of $k^{th}$ and $k+1^{th}$ output bumps OBk and OBk+1 overlapping the resistor group RG, the first diode group D1G, and the second diode group D2G, in the COG type.

Moreover, as in FIG. 5, in the COF type, the output bumps OB1 to OBn of the source drive IC 20 may be disposed in both edges of a first side S1, a third side S3, and a fourth side S4 as well as a second side S2. That is, a same number of output bumps OB1 to OBn may be disposed in a narrower area in the COG type than the COF type. Therefore, a pitch P4 of each output bump of the source drive IC 20 attached as the COG type as in FIG. 10 may be less than a pitch P2 of each output bump of the source drive IC 20 attached as the COF type as in FIG. 4. Thus, the number of output bumps OBk, OBk+1, and OBk+2 overlapping the resistor group RG, the first diode group D1G, and the second diode group D2G of the source drive IC 20 using the COG type as in FIG. 11 may be larger than the number of output bumps OBk and OBk+1 overlapping the resistor group RG, the first diode group D1G, and the second diode group D2G of the source drive IC 20 using the COF type as in FIG. 6.

Moreover, in FIG. 11, it is illustrated that the resistor group RG includes three resistor parts R1 to R3, the first diode group D1G includes three first diode parts D11 to D13, and the second diode group D2G includes three second diode parts D21 to D23, but the present embodiment is not limited thereto. Also, in FIG. 11, it is illustrated that three output bumps OBk, OBk+1, and OBk+2 overlap the resistor group RG, the first diode group D1G, and the second diode group D2G, but the present embodiment is not limited thereto.

The $k^{th}$ output bump OBk may be connected to at least one of the plurality of first diode parts D11 to D13 and at least one of the plurality of second diode parts D21 to D23. The $k+1^{th}$ output bump OBk+1 adjacent to the $k^{th}$ output bump OBk may be connected to at least one of the plurality of first diode parts D11 to D13 unconnected to the $k^{th}$ output bump OBk and at least one of the plurality of second diode parts D21 to D23 unconnected to the $k^{th}$ output bump OBk. The $k+2^{th}$ output bump OBk+2 adjacent to the $k+1^{th}$ output bump OBk+1 may be connected to at least one of the plurality of first diode parts D11 to D13 unconnected to the $k^{th}$ output bump OBk and the $k+1^{th}$ output bump OBk+1 and at least one of the plurality of second diode parts D21 to D23 unconnected to the $k^{th}$ output bump OBk and the $k+1^{th}$ output bump OBk+1.

For example, as in FIG. 11, the $k^{th}$ output bump OBk may be connected to a $1\text{-}1^{th}$ diode part D11 and a $2\text{-}1^{th}$ diode part D21. The $k^{th}$ output bump OBk may be connected to the $1\text{-}1^{th}$ diode part D11 through a first via V1 and may be connected to the $2\text{-}1^{th}$ diode part D21 through a second via V2. Also, the $k+1^{th}$ output bump OBk+1 may be connected to a $1\text{-}2^{th}$ diode part D12 and a $2\text{-}2^{th}$ diode part D22. The $k+1^{th}$ output bump OBk+1 may be connected to the $1\text{-}2^{th}$ diode part D12 through a third via V3 and may be connected to the $2\text{-}2^{th}$ diode part D22 through a fourth via V4. Also, the $k+2^{th}$ output bump OBk+2 may be connected to a $1\text{-}3^{th}$ diode part D13 and a $2\text{-}3^{th}$ diode part D23. The $k+2^{th}$ output bump OBk+2 may be connected to the $1\text{-}3^{th}$ diode part D13 through a fifth via V5 and may be connected to the $2\text{-}3^{th}$ diode part D23 through a sixth via V6.

Each of the plurality of first diode parts D11 to D13 and each of the plurality of second diode parts D21 to D23 may be long provided in a first direction (an X-axis direction), and in this case, each of the $k^{th}$ output bump OBk, the $k+1^{th}$ output bump OBk+1, and the $k+2^{th}$ output bump OBk+2 may be long provided in a second direction (a Y-axis direction).

The cross-sectional view taken along line III-III' illustrated in FIG. 11 is substantially the same as described above with reference to FIGS. 7A to 7D and 9, and thus, its detailed description is omitted.

Figure 12:
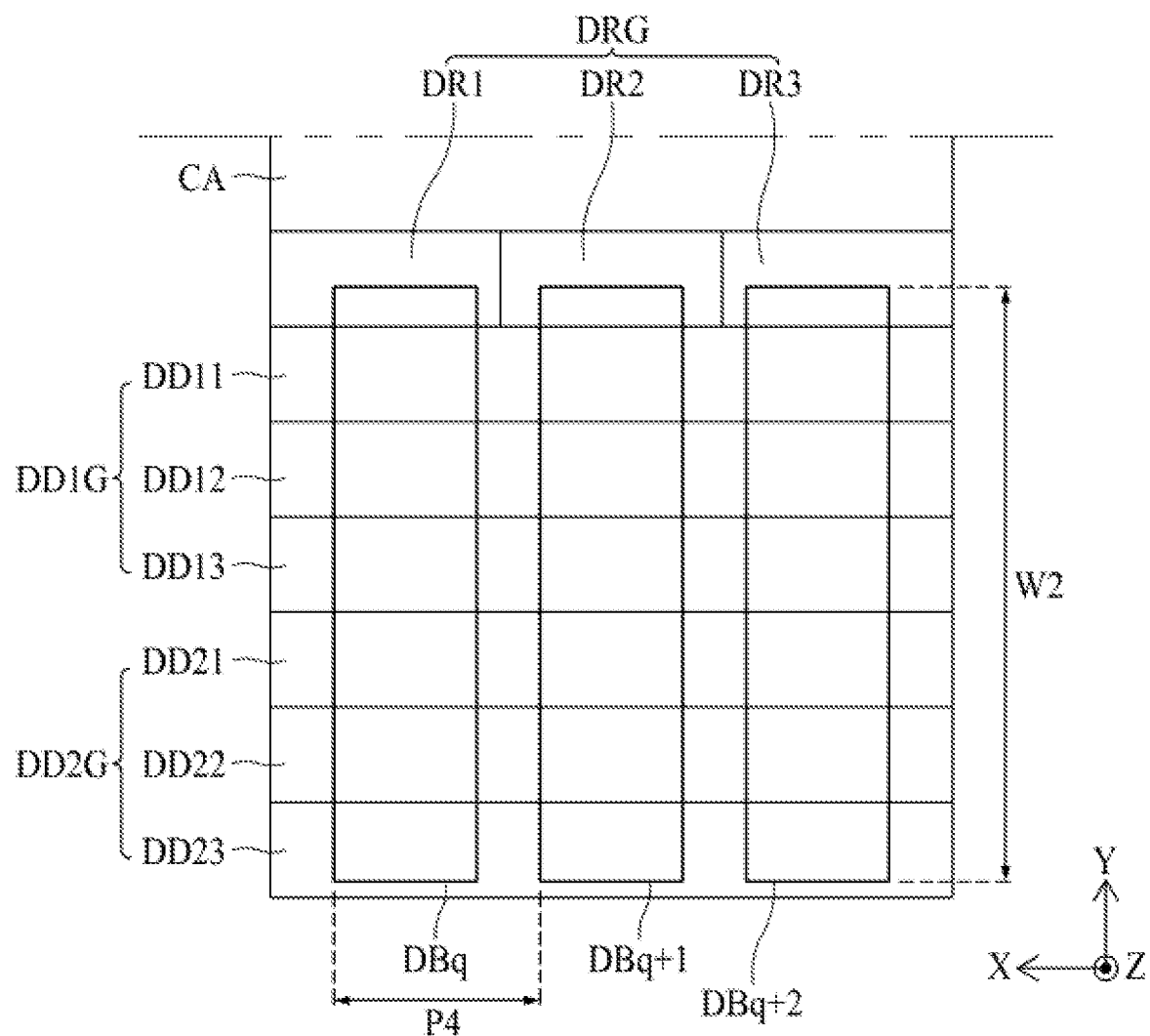
FIG. 12 is a plan view illustrating an example of a dummy pad part of a source drive IC when a COG type is applied.

FIG. 12 is a plan view illustrating an example of a first dummy pad part DPA1 of a source drive IC when the COG type is applied.

In FIG. 12, for convenience of description, only one dummy resistor group DRG, one first dummy diode group DD1G, one second dummy diode group DD2G, and $q^{th}$, $q+1^{th}$, and $q+2^{th}$ dummy bumps DBq, DBq+1, and DBq+2, overlapping the groups, of the first dummy pad part DPA1 of the source drive IC are illustrated. However, the first dummy pad part DPA1 of the source drive IC may include a plurality of dummy resistor groups DRG, a plurality of first dummy diode groups DD1G, a plurality of second dummy diode groups DD2G, and a plurality of dummy bumps DB1 to DBp.

A dummy resistor may be provided in each of a plurality of dummy resistor parts DR1 to DR3 of the dummy resistor group DRG. Also, a dummy diode may be provided in each of a plurality of first dummy diode parts DD11 to DD13 of the first dummy diode group DD1G, and a dummy diode may be provided in each of a plurality of second dummy diode parts DD21 to DD23 of the second dummy diode group DD2G. The dummy resistor and the dummy diodes may be elements which do not operate in circuit. For example, an anode and a cathode of each of the dummy diodes may be floated, or the same voltage may be applied to the anode and the cathode of each of the dummy diodes. Also, the dummy resistor may not be connected to the dummy diodes at a contact point CP. A core part CA, the plurality of dummy resistor parts DR1 to DR3 of the dummy resistor group DRG, the plurality of first dummy diode parts DD11 to DD13 of the first dummy diode group DD1G, and the plurality of second dummy diode parts DD21 to DD23 of the second dummy diode group DD2G illustrated in FIG. 12 are substantially the same as described above with reference to FIG. 6, and thus, their detailed descriptions are omitted.

Moreover, in the COG type, the number of dummy resistor parts DR1 to DR3 of the dummy resistor group DRG, the number of first dummy diode parts DD11 to DD13 of the first dummy diode group DD1G, and the number of second dummy diode parts DD21 to DD23 of the second dummy diode group DD2G in the source drive IC may be equal to or larger than the number of dummy bumps DBq, DBq+1, and DBq+2 overlapping the dummy resistor group DRG, the first dummy diode group DD1G, and the second dummy diode group DD2G. However, as the number of dummy resistor parts DR1 to DR3, the number of first dummy diode parts DD11 to DD13 of the first dummy diode group DD1G, and the number of second dummy diode parts DD21 to DD23 of the second dummy diode group DD2G increase, a width W2 of the first dummy pad part DPA1 in a second direction (a Y-axis direction) may be widened. Therefore, considering the width W2 of the first dummy pad part DPA1 in the second direction (the Y-axis direction), the number of dummy resistor parts DR1 to DR3 of the dummy resistor group DRG, the number of first dummy diode parts DD11 to DD13 of the first dummy diode group DD1G, and the number of second dummy diode parts DD21 to DD23 of the second dummy diode group DD2G in the source drive IC may be the same as the number of dummy bumps DBq, DBq+1, and DBq+2 overlapping the dummy resistor group DRG, the first dummy diode group DD1G, and the second dummy diode group DD2G, in the COG type.

Moreover, a pitch P4 of each output bump of the source drive IC attached as the COG type as in FIG. 10 may be less than a pitch P2 of each output bump of the source drive IC attached as the COF type as in FIG. 6. Also, the pitch P4 of each output bump of the source drive IC attached as the COG type as in FIG. 10 may be substantially the same as a pitch P4 of each dummy bump. Thus, the number of dummy bumps DBq, DBq+1, and DBq+2 overlapping the dummy resistor group DRG, the first dummy diode group DD1G, and the second dummy diode group DD2G of the source drive IC using the COG type as in FIG. 12 may be larger than the number of output bumps OBk and OBk+1 overlapping the dummy resistor group DRG, the first dummy diode group DD1G, and the second dummy diode group DD2G of the source drive IC using the COF type. Also, in the COG type, the number of output bumps OBk, OBk+1, and OBk+2 overlapping the dummy resistor group DRG, the first dummy diode group DD1G, and the second dummy diode group DD2G of the source drive IC may be the same as the number of dummy bumps DBq, DBq+1, and DBq+2 overlapping the dummy resistor group DRG, the first dummy diode group DD1G, and the second dummy diode group DD2G of the source drive IC.

Moreover, in FIG. 12, it is illustrated that the dummy resistor group DRG includes three dummy resistor parts DR1 to DR3, the first dummy diode group DD1G includes three first dummy diode parts DD11 to DD13, and the second dummy diode group DD2G includes three second dummy diode parts DD21 to DD23, but the present embodiment is not limited thereto. Also, in FIG. 12, it is illustrated that three dummy bumps DBq, DBq+1, and DBq+2 overlap the dummy resistor group DRG, the first dummy diode group DD1G, and the second dummy diode group DD2G, but the present embodiment is not limited thereto.

Each of the $q^{th}$, $q+1^{th}$, and $q+2^{th}$ dummy bumps DBq, DBq+1, and DBq+2 may not be connected to any one of the dummy resistor parts DR1 to DR3 of the dummy resistor group DRG, the first dummy diode parts DD11 to DD13 of the first dummy diode group DD1G, and the second dummy diode parts DD21 to DD23 of the second dummy diode group DD2G.

Each of the plurality of first dummy diode parts DD11 to DD13 and each of the plurality of second dummy diode parts DD21 to DD23 may be long provided in a first direction (an X-axis direction), and in this case, each of the $q^{th}$, $q+1^{th}$ and $q+2^{th}$ dummy bumps DBq, DBq+1, and DBq+2 may be long provided in a second direction (a Y-axis direction).

A second dummy pad part DPA2 is substantially the same as the illustration of FIG. 12, and thus, its detailed description is omitted.

The cross-sectional view taken along line IV-IV' illustrated in FIG. 12 is substantially the same as described above with reference to FIGS. 7A to 7D and 9, and thus, its detailed description is omitted.

As described above, in an embodiment of the present disclosure, each of bumps disposed in both edges of a first side S1, a third side S3, and a fourth side S4 of the source drive IC may be provided as one of an output bump and a dummy bump, based on whether the source drive IC is attached as the COF type or the COG type. That is, in an embodiment of the present disclosure, only a design of each of the bumps disposed in the both edges of the first side S1, the third side S3, and the fourth side S4 of the source drive IC may be modified based on the COF type or the COG type. Accordingly, in an embodiment of the present disclosure, the source drive IC capable of being applied to all of the COF type and the COF type may be provided.

Moreover, in an embodiment of the present disclosure, for convenience of description, the source drive IC based on the COF type and the COF type has been described above, but embodiments of the present disclosure are not limited thereto. That is, a description of the source drive IC according to an embodiment of the present disclosure may be applied to the gate drive IC 30 according to an embodiment of the present disclosure through modification within the scope modifiable by those skilled in the art.

As described above, according to the embodiments of the present disclosure, each of bumps disposed in upper both edges, a left side, and a right side of the source drive IC may be provided as one of an output bump and a dummy bump, based on whether the source drive IC is attached as the COF type or the COF type. That is, according to the embodiments of the present disclosure, only a design of each of the bumps disposed in the upper both edges, the left side, and the right side of the source drive IC may be modified based on the COF type or the COF type. Accordingly, according to the embodiments of the present disclosure, the source drive IC capable of being applied to all of the COF type and the COF type may be provided.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A drive integrated circuit (IC) comprising:
an input pad part including a plurality of input bumps; and
an output pad part including a plurality of first diode parts, a plurality of second diode parts, and a plurality of output bumps,
wherein
at least two of the plurality of output bumps overlap the plurality of first diode parts and the plurality of second diode parts, and
a first output bump of the at least two output bumps is connected to at least one of the plurality of first diode parts and at least one of the plurality of second diode parts.

2. The drive IC of claim 1, wherein a second output bump of the at least two output bumps is connected to at least one of the plurality of first diode parts unconnected to the first output bump and at least one of the plurality of second diode parts unconnected to the first output bump.

3. The drive IC of claim 2, wherein the first output bump or the second output bump is connected to at least two of the plurality of first diode parts and at least two of the plurality of second diode parts.

4. The drive IC of claim 1, wherein a pitch of each of the plurality of output bumps is less than a pitch of each of the plurality of input bumps.

5. The drive IC of claim 1, wherein number of the plurality of first diode parts and number of the plurality of second diode parts are larger than number of output bumps overlapping the plurality of first diode parts and the plurality of second diode parts.

6. The drive IC of claim 1, wherein each of the plurality of first diode parts and each of the plurality of second diode parts are long provided in a first direction, and each of the plurality of output bumps is long provided in a second direction intersecting the first direction.

7. The drive IC of claim 1, wherein
the input pad part is disposed in a first side of the drive IC, and
the output pad part is disposed in a second side facing the first side, a third side connecting one end of the first side to one end of the second side, and a fourth side connecting another end of the first side to another end of the second side in the drive IC.

8. The drive IC of claim 1, wherein
the output pad part further comprises a plurality of resistor parts, and
the first output bump is connected to one of the plurality of resistor parts.

9. The drive IC of claim 1, further comprising a dummy pad part including a plurality of first dummy diode parts, a plurality of second dummy diode parts, and a plurality of dummy bumps.

10. The drive IC of claim 9, wherein a first dummy bump of the plurality of dummy bumps overlaps the plurality of first dummy diode parts and the plurality of second dummy diode parts and is connected to one of the plurality of first dummy diode parts and one of the plurality of second dummy diode parts.

11. The drive IC of claim 9, wherein a pitch of each of the plurality of dummy bumps is the same as a pitch of each of the plurality of output bumps.

12. The drive IC of claim 9, wherein a pitch of each of the plurality of dummy bumps is smaller than a pitch of each of the plurality of input bumps.

13. The drive IC of claim 9, wherein number of the plurality of first diode parts and number of the plurality of second diode parts are the same as number of output bumps overlapping the plurality of first diode parts and the plurality of second diode parts.

14. The drive IC of claim 9, wherein
the input pad part is disposed in a first side of the drive IC,
the output pad part is disposed in a second side of the drive IC facing the first side, and
the dummy pad part is disposed in a third side connecting one end of the first side to one end of the second side and a fourth side connecting another end of the first side to another end of the second side in the drive IC.

15. The drive IC of claim 9, wherein each of the plurality of first dummy diode parts and each of the plurality of second dummy diode parts are long provided in a first direction, and each of the plurality of dummy bumps is long provided in a second direction intersecting the first direction.

16. The drive IC of claim 9, wherein
the dummy pad part further comprises a plurality of dummy resistor parts, and
the first dummy bump is connected to one of the plurality of dummy resistor parts.

17. A display device comprising:
a lower substrate;
a plurality of gate lines and a plurality of data lines each provided on the lower substrate; and
a drive integrated circuit (IC) electrically connected to the plurality of gate lines or the plurality of data lines,
wherein
the drive IC comprises:
an input pad part including a plurality of input bumps; and
an output pad part including a plurality of first diode parts, a plurality of second diode parts, and a plurality of output bumps,
a first output bump of the plurality of output bumps overlaps the plurality of first diode parts and the plurality of second diode parts, and
the first output bump is connected to at least one of the plurality of first diode parts and at least one of the plurality of second diode parts.

18. The display device of claim 17, further comprising a flexible film, the drive IC being mounted on the flexible film,
wherein the flexible film is attached on a pad part provided on the lower substrate.

19. The display device of claim 17, further comprising a dummy pad part including a plurality of first dummy diode parts, a plurality of second dummy diode parts, and a plurality of dummy bumps.

20. The display device of claim 19, wherein the drive IC is attached on a pad part provided on the lower substrate.

* * * * *